United States Patent
Asano et al.

(10) Patent No.: US 9,653,025 B2
(45) Date of Patent: *May 16, 2017

(54) DISPLAY DEVICE AND ELECTRONIC APPARATUS

(71) Applicant: Sony Corporation, Tokyo (JP)

(72) Inventors: Mitsuru Asano, Kanagawa (JP); Yukihito Iida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/139,791

(22) Filed: Apr. 27, 2016

(65) Prior Publication Data

US 2016/0240137 A1  Aug. 18, 2016

Related U.S. Application Data

(63) Continuation of application No. 14/541,482, filed on Nov. 14, 2014, now Pat. No. 9,368,065, which is a
(Continued)

(30) Foreign Application Priority Data

Jan. 9, 2009  (JP) ................. 2009-003201

(51) Int. Cl.
*H01L 33/08* (2010.01)
*G09G 3/3233* (2016.01)
(Continued)

(52) U.S. Cl.
CPC ......... *G09G 3/3233* (2013.01); *G09G 3/3258* (2013.01); *G09G 3/3266* (2013.01);
(Continued)

(58) Field of Classification Search
CPC ....... H01L 33/08; H01L 33/005; H01L 27/12; H01L 27/1255; H01L 27/3262; H01L 27/3276
(Continued)

(56) References Cited

U.S. PATENT DOCUMENTS 5,998,805 A   12/1999  Shi et al.
6,583,581 B2   6/2003  Kaneko et al.
(Continued)

FOREIGN PATENT DOCUMENTS

EP   1 096 303 A2   5/2001
EP   1 772 847 A1   4/2007
(Continued)

OTHER PUBLICATIONS

European Search Report issued Jul. 11, 2012 for corresponding European Applcation No. 09 25 2888.
(Continued)

Primary Examiner — Mark Tornow
(74) Attorney, Agent, or Firm — Michael Best & Friedrich LLP

(57) ABSTRACT

A display panel including pixels disposed on a substrate, where each of the pixels includes a light emitting element, and a capacitor. The capacitor of a first one of the pixels is partially overlapped, in a vertical direction, by respective pixel areas of two of the pixels. The anode of the capacitor of the first one of the pixels may be disposed closer to the substrate than a cathode of the capacitor, thereby reducing a parasitic capacitance between the capacitor and an anode of the light emitting element of one of the two pixels overlapping the capacitor.

28 Claims, 21 Drawing Sheets

Related U.S. Application Data continuation of application No. 13/688,581, filed on Nov. 29, 2012, now Pat. No. 8,921,865, which is a continuation of application No. 12/657,090, filed on Dec. 10, 2009, now Pat. No. 8,344,388.

(51) Int. Cl.
*G09G 5/00* (2006.01)
*G09G 5/02* (2006.01)
*H01L 33/00* (2010.01)
*H01L 27/12* (2006.01)
*G09G 3/3258* (2016.01)
*G09G 3/3266* (2016.01)
*H01L 27/32* (2006.01)
*H01L 27/13* (2006.01)

(52) U.S. Cl.
CPC ............ *G09G 5/003* (2013.01); *G09G 5/026* (2013.01); *H01L 27/12* (2013.01); *H01L 27/1255* (2013.01); *H01L 27/3262* (2013.01); *H01L 27/3265* (2013.01); *H01L 27/3276* (2013.01); *H01L 33/005* (2013.01); *H01L 33/08* (2013.01); *G09G 2300/0426* (2013.01); *G09G 2300/0452* (2013.01); *G09G 2300/0819* (2013.01); *G09G 2300/0842* (2013.01); *G09G 2300/0852* (2013.01); *G09G 2300/0866* (2013.01); *G09G 2320/0219* (2013.01); *G09G 2320/043* (2013.01); *H01L 27/13* (2013.01); *H01L 27/3211* (2013.01)

(58) Field of Classification Search
USPC .................................. 257/59, 72; 345/76, 80
See application file for complete search history.

(56) References Cited

U.S. PATENT DOCUMENTS

| | | | | |
|---|---|---|---|---|
| 8,344,388 | B2* | 1/2013 | Asano | G09G 3/3233 257/59 |
| 8,921,865 | B2* | 12/2014 | Asano | G09G 3/3233 257/59 |
| 9,368,065 | B2* | 6/2016 | Asano | G09G 3/3233 |
| 2004/0004221 | A1* | 1/2004 | Murade | H01L 29/78609 257/72 |
| 2006/0176250 | A1 | 8/2006 | Nathan et al. | |
| 2008/0030437 | A1* | 2/2008 | Iida | G09G 3/3233 345/80 |
| 2008/0224964 | A1 | 9/2008 | Tanikame et al. | |
| 2008/0231625 | A1 | 9/2008 | Minami et al. | |

FOREIGN PATENT DOCUMENTS

| | | |
|---|---|---|
| JP | 2006-133542 | 5/2006 |
| JP | 2008-249919 A | 10/2008 |
| KR | 20070038915 A | 4/2007 |

OTHER PUBLICATIONS

European Patent Office Communication Pursuant to Article 94(3) EPC for Corresponding European Application No. 09 252 888.4.
Extended European Search Report issued Jun. 25, 2013 for corresponding European Application No. 12 19 6031.
Korean Office Action issued Oct. 27, 2014 for corresponding Korean Application No. 10-2010-0001174.

* cited by examiner t=t8 t=t9 t=t10

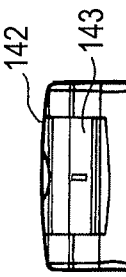
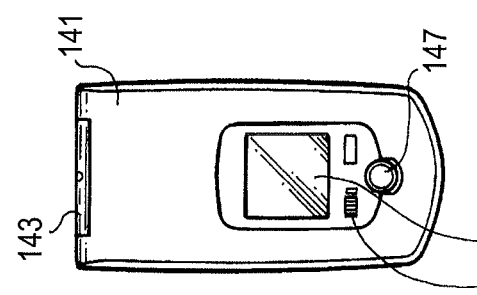
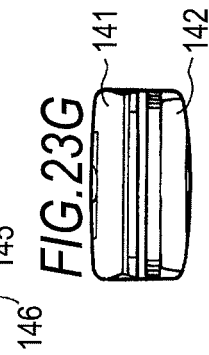
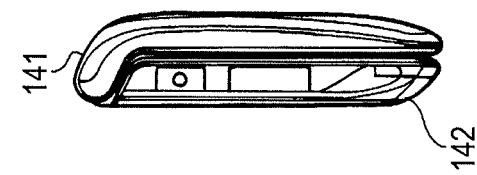
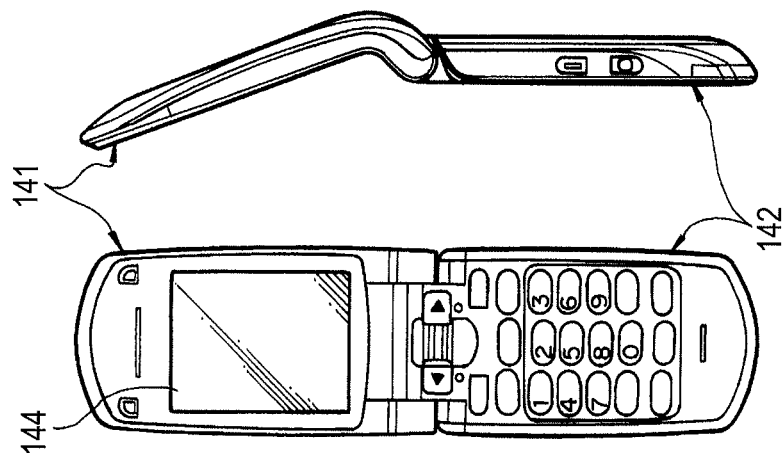

DISPLAY DEVICE AND ELECTRONIC APPARATUS

FIELD OF THE INVENTION

This is a Continuation application of U.S. patent application Ser. No. 14/541,482, filed Nov. 14, 2014, which is a Continuation application of U.S. patent application Ser. No. 13/688,581, filed Nov. 29, 2012, now U.S. Pat. No. 8,921,865, issued on Dec. 30, 2014, which is a Continuation Application of U.S. patent application Ser. No. 12/654,090, filed Dec. 10, 2009, now U.S. Pat. No. 8,344,388, issued on Jan. 1, 2013, which in turn claims priority from Japanese Application No. 2009-003201 filed in the Japan Patent Office on Jan. 9, 2009, the entire contents of which being incorporated herein by reference.

BACKGROUND OF THE INVENTION

Description of the Related Art

Recently, in the field of display devices that perform image display, flat type display devices formed by disposing pixels (pixel circuits) including light emitting elements in a matrix form have been spreading rapidly. As the flat type display devices, organic EL display devices using organic EL (electroluminescence) elements that utilize a phenomenon of light emission at the time of applying an electric field, for example, to an organic thin film have been developed and commercialized.

The organic EL display device has the following features. The organic EL element can be driven by an application voltage of 10 V or less, and thus has low power consumption. In addition, since the organic EL element is a self-luminous element, the organic EL display does not need a light source (back light) that may be essential to a liquid crystal display device. In addition, the response speed of the organic EL element is very high with response time of several microseconds, and accordingly, no afterimage occurs at the time of displaying a motion picture.

Similarly to the liquid crystal display device, a simple (passive) matrix type or an active matrix type may be used as a driving method of the organic EL display device. Recently, active matrix-type display devices in which an active element such as an insulated gate-type field effect transistor (generally, TFT (thin film transistor)) is disposed in a pixel circuit have been actively developed.

It is generally known that the I-V characteristics (current-voltage characteristics) of the organic EL element degrade as time elapses (so-called degradation over time). In addition, a threshold voltage Vth of a driving transistor or the mobility $\mu$ of a semiconductor thin film that configures a channel of the driving transistor (hereinafter, described as "mobility of a driving transistor") changes over time or may be different for each pixel due to a deviation in the manufacturing process thereof.

Accordingly, in order to maintain emission luminance of the organic EL element to be constant without being affected by the above-described factors, a configuration in which a compensation function for characteristic variances in the organic EL element and correction functions including a correction function for variances in the threshold voltage Vth of the driving transistor (hereinafter, described as "threshold value correction") or a correction function for variances in the mobility $\mu$ of the driving transistor are included in each pixel circuit has been used (for example, see JP-A-2006-133542).

SUMMARY OF THE INVENTION

Here, in a pixel layout in related art, pixels are disposed such that the TFT layout area is asymmetric in accordance with the size (constant) of each pixel circuit. On the other hand, pixels corresponding to each color of R (red), G (green), and B (blue) are disposed at a constant pitch. Thus, when the size of a constituent element of a specific pixel is larger than that of a different pixel so as to increase the layout density thereof, a part of the constituent element having high layout density is disposed in a space of a pixel having low layout density. In such a case, parasitic capacitance is generated between a source electrode of a driving transistor of the different pixel and an upper electrode of an auxiliary capacitor of the specific pixel. As a result, there is a problem in that the reference electric potential is affected by the parasitic capacitance so as to decrease the luminance.

Therefore, there is a need for providing technology for preventing luminance changes due to formation of parasitic capacitance between an electrode of an auxiliary capacitor of one pixel of adjacent pixels and an electrode of the other pixel.

According to an aspect of an exemplary illustration of the present invention, a display panel is provided, comprising a plurality of pixels disposed on a substrate. Each of the plurality of pixels may include a light emitting element, and a capacitor. The capacitor of a first one of the plurality of pixels may be partially overlapped, in a direction orthogonal to the substrate, by respective pixel areas of two of the plurality of pixels.

According to another aspect of the exemplary illustration of the present invention, the capacitor of the first one of the plurality of pixels may be partially overlapped, in a direction orthogonal to the substrate, by respective first electrodes of the light emitting elements of the two of the plurality of pixels.

According to another aspect of the exemplary illustration of the present invention, the respective first electrodes of the light emitting elements of the two of the plurality of pixels may be anode electrodes.

According to another aspect of the exemplary illustration of the present invention, the capacitor of the first one of the plurality of pixels may be connected to a first electrode, which may be an anode electrode, of the light emitting element thereof.

According to another aspect of the exemplary illustration of the present invention, the capacitor of the first one of the plurality of pixels may not be connected to a first electrode, which may be an anode electrode, of the light emitting element of any of the plurality of pixels other than the one of the plurality of pixels.

According to another aspect of the exemplary illustration of the present invention, the first one of the plurality of pixels may be also one of the two of the plurality of pixels whose respective pixel areas overlap the capacitor of the first one of the plurality of pixels.

According to another aspect of the exemplary illustration of the present invention, a capacitance of the capacitor of the first one of the plurality of pixels may be different from a capacitance of the capacitor of at least one other of the plurality of pixels.

According to another aspect of the exemplary illustration of the present invention, the first one of the plurality of pixels may be a blue pixel.

According to another aspect of the exemplary illustration of the present invention, one of the two of the plurality of pixels whose respective pixel areas overlap the capacitor of the first one of the plurality of pixels may be a blue pixel.

According to another aspect of the exemplary illustration of the present invention, the other one of the two of the plurality of pixels whose respective pixel areas overlap the capacitor of the first one of the plurality of pixels may be a green pixel.

According to another aspect of the exemplary illustration of the present invention, a capacitance of the capacitor of the blue pixel may be larger than a capacitance of the capacitor of the other one of the two of the plurality of pixels whose respective pixel areas overlap the capacitor of the first one of the plurality of pixels.

According to another aspect of the exemplary illustration of the present invention, each of the plurality of pixels may further include a driving transistor, which has a first current electrode connected to the light emitting element and to the capacitor and which may be configured to supply a drive current corresponding to a voltage between the first current electrode and a gate electrode thereof to the light emitting element, and a sampling transistor configured to sample a video signal. Furthermore, for each of the plurality of pixels, a first electrode of the capacitor may be connected to a first electrode of the light emitting element, which may be an anode electrode.

According to another aspect of the exemplary illustration of the present invention, for each of the plurality of pixels, a second electrode of the capacitor may be connected to the gate electrode of the driving transistor and the capacitor may be configured to store a potential corresponding to the video signal sampled by the sampling transistor.

According to another aspect of the exemplary illustration of the present invention, for each of the plurality of pixels, the first electrode of the capacitor may be disposed further from the first electrode of the light emitting element than a second electrode of the capacitor.

According to another aspect of the exemplary illustration of the present invention, for each of the plurality of pixels, a second electrode of the capacitor may be connected to a second electrode of the light emitting element, which may be a cathode electrode.

According to another aspect of the exemplary illustration of the present invention, the plurality of pixels may be grouped into color image formation units, each comprising N≥3 ones of the plurality of pixels that each have a color different from that of the other pixels of the unit, each unit including at least a blue pixel, a green pixel, and a red pixel. Furthermore, the two of the plurality of pixels whose respective pixel areas overlap the capacitor of the first one of the plurality of pixels may be grouped in the same unit as the first one of the plurality of pixels.

According to another aspect of the exemplary illustration of the present invention, the first one of the plurality of pixels may be a blue pixel.

According to another aspect of the exemplary illustration of the present invention, one of the two of the plurality of pixels whose respective pixel areas overlap the capacitor of the first one of the plurality of pixels may be a blue pixel.

According to an aspect of a second exemplary illustration of the present invention, a display panel may be manufactured by forming a plurality of pixels on a substrate, wherein each of the plurality of pixels includes a light emitting element, and a capacitor. Furthermore, the capacitor of a first one of the plurality of pixels may be at least partially overlapped, in a direction orthogonal to the substrate, by respective pixel areas of two of the plurality of pixels.

According to an aspect of a third exemplary illustration of the present invention, a display panel may be manufactured by providing a substrate; forming a plurality of pixel circuits on the substrate, each of the plurality of pixel circuits including a driving transistor, a sampling transistor, and a capacitor; and forming a plurality of light emitting elements on the plurality of pixel circuits, the plurality of light emitting elements being electrically connected to respective ones of the plurality of pixel circuits. Furthermore, an anode electrode of the capacitor of one of the plurality of pixel circuits may be disposed closer to the substrate than a cathode electrode of the capacitor of the one of the plurality of pixel circuits and a first one of the plurality of light emitting elements and a second one of the plurality of light emitting elements may be formed such that they both at least partially overlap, in a direction orthogonal to the substrate, the capacitor of the one of the plurality of pixel circuits.

According to an aspect of a fourth exemplary illustration of the present invention, there may be provided a display device including: a pixel array unit having pixels including a circuit configuration, in which a first electrode of an electro-optical element and a source electrode of a driving transistor may be connected together, a gate electrode of the driving transistor and a source electrode or a drain electrode of a writing transistor may be connected together, a holding capacitor may be connected between the gate electrode and the source electrode of the driving transistor, and an auxiliary capacitor may be connected between the first electrode and a second electrode of the electro-optical element, disposed on a substrate in a matrix shape. From one pixel of adjacent pixels to an area of the other pixel, the auxiliary capacitor of the one pixel may be set to be disposed, and an electrode of the auxiliary capacitor that may be disposed on the electro-optical element side may be conductive with the second electrode of the electro-optical element. The embodiment of the invention also provides an electronic apparatus that has the above-described display device disposed in a main body casing.

According to another aspect of the fourth exemplary illustration of the present invention, from one pixel of adjacent pixels to an area of the other pixel, the auxiliary capacitor of the one pixel may be set to be disposed, and an electrode of the auxiliary capacitor that may be disposed on the electro-optical element side may be conductive with the second electrode of the electro-optical element. In other words, an electrode of the auxiliary capacitor, which may be disposed on the upper side, has a cathode electric potential, and the electrode having the cathode electric potential may be interposed between the anode electrode of the other pixel and the electrode of the auxiliary capacitor of the one pixel that has the anode electric potential. A shield effect may be exhibited by the electrode having the cathode electric potential.

According to an aspect of a fifth exemplary illustration of the present invention, there may be provided a display device including: a pixel array unit having pixels including a circuit configuration, in which a first electrode of an electro-optical element and a source electrode of a driving transistor may be connected together, a gate electrode of the driving transistor and a source electrode or a drain electrode of a writing transistor may be connected together, a holding capacitor may be connected between the gate electrode and the source electrode of the driving transistor, and an auxiliary capacitor may be connected between the first electrode and a second electrode of the electro-optical element, disposed on a substrate in a matrix shape. From one pixel of adjacent pixels to an area of the other pixel, the auxiliary capacitor of the one pixel may be set to be disposed, and a shield electrode, which may be conductive with the second electrode of the electro-optical element, may be disposed between the auxiliary capacitor and the first electrode of the electro-optical element of the other pixel.

According to another aspect of the fifth exemplary illustration of the present invention, between the electrode of the electrodes of the auxiliary capacitor of one pixel of adjacent pixels that may be disposed on the electro-optical element side and the anode electrode of the other pixel can be shielded by the shield electrode that may be conductive with the cathode electrode.

According to the exemplary illustrations of the present invention, in a circuit configuring a pixel, luminance changes due to formation of parasitic capacitance between an electrode of an auxiliary capacitor of one pixel of adjacent pixels and an electrode of the other pixel can be prevented.

BRIEF DESCRIPTION OF THE DRAWINGS

FIG. 20A is a perspective view viewed from the front side, and FIG. 20B is a perspective view viewed from the rear side.

FIGS. 23A to 23G are diagrams showing the outer appearances of a cellular phone, to which this embodiment is applied. FIG. 23A is a front view in an open state, FIG. 23B is a side view thereof, FIG. 23C is a front view in a closed state, FIG. 23D is a left side view, FIG. 23E is a right side view, FIG. 23F is a top view, and FIG. 23G is a bottom view.

DESCRIPTION OF THE PREFERRED EMBODIMENTS

Hereinafter, an embodiment of the present invention (hereinafter, referred to as an "embodiment") will be described. The description thereof will be followed in the following order.

1. Display Device (System Configuration, Pixel Circuit, and Circuit Operation) As Premise of This Embodiment
2. Problem in Pixel Structure in Related Art (Pixel Circuit, Layout, Circuit Diagram Configuring Parasitic Capacitance, and Timing Chart)
3. Configuration Example According To This Embodiment (System Configuration and Example of Wiring Structure)
4. Applications (Various Applications to Electronic Apparatuses)

1. Display Device (System Configuration, Pixel Circuit, and Circuit Operation) as Premise of this Embodiment
System Configuration FIG. 1 is a schematic diagram of a system configuration that represents an active-matrix type display device that is a premise of this embodiment.

Here, as an example, an organic EL display device of an active-matrix type that uses an electro-optical element of a current-driven type of which emission luminance changes in accordance with the value of a current flowing through the device such as an organic EL element (organic electroluminescence element) as a light emitting element of a pixel (pixel circuit) will be described.

Figure 1:
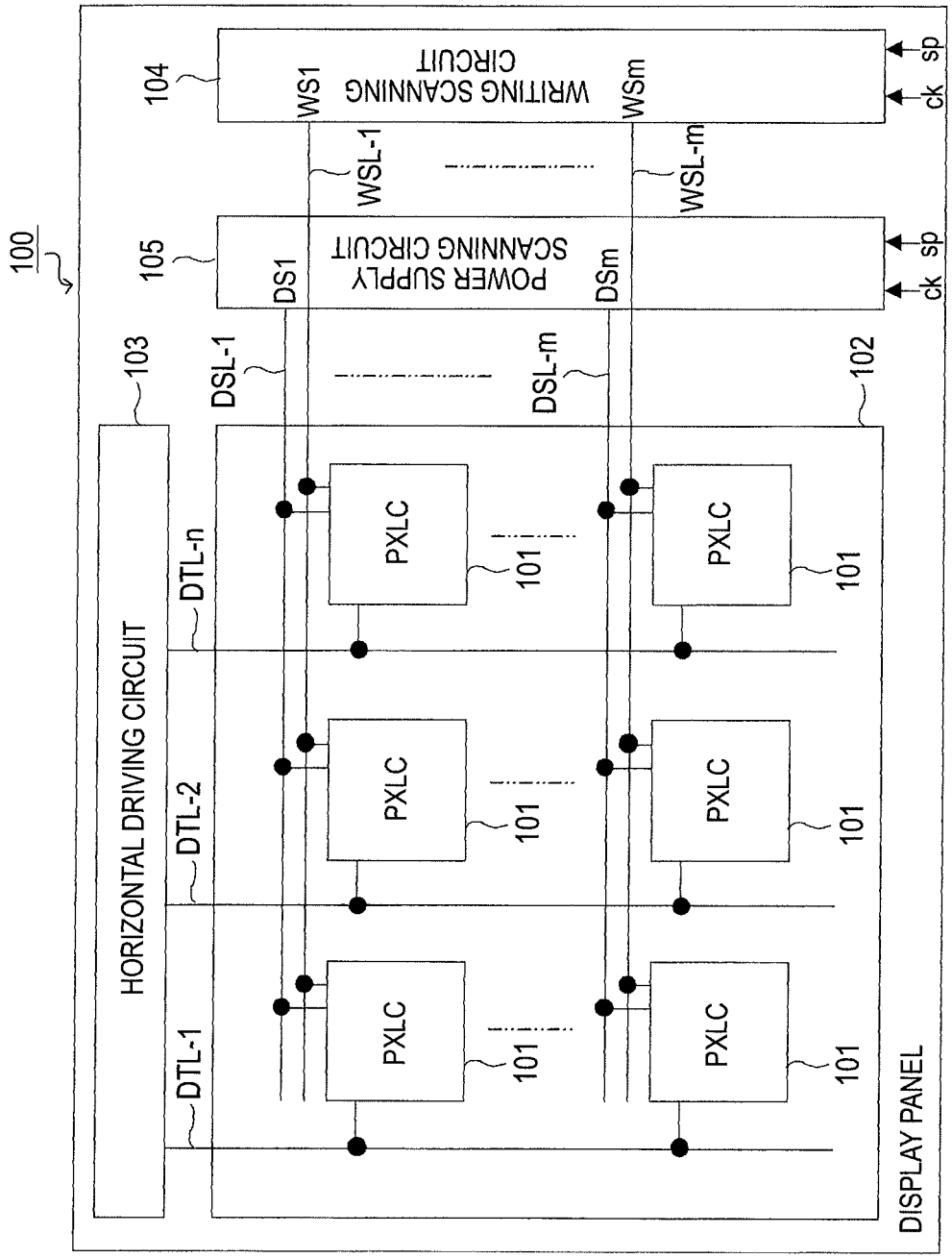
FIG. 1 is a schematic diagram of a system configuration that represents an active-matrix type organic EL display device that serves as a premise of an embodiment of the present invention.

As represented in FIG. 1, an organic EL display device 100 has a configuration including a pixel array unit 102 formed by two-dimensionally disposing pixels (PXLC) 101 in a matrix shape and a driving unit that is disposed on the periphery of the pixel array unit 102 and drives each pixel 101. As the driving unit that drives the pixels 101, for example, a horizontal driving circuit 103, a writing scanning circuit 104, and a power supply scanning circuit 105 are disposed.

In the pixel array unit 102, in the pixel array of m rows and n columns, scanning lines WSL-1 to WSL-m and power supply lines DSL-1 to DSL-m are wired for each pixel row, and signal lines DTL-1 to DTL-n are wired for each pixel column.

The pixel array unit 102, generally, is formed on a transparent insulating substrate such as a glass substrate and has a flat-type panel structure. Each pixel 101 of the pixel array unit 102 may be formed by an amorphous silicon TFT (thin film transistor) or a low-temperature poly silicon TFT. When the low-temperature polysilicon TFT is used, the horizontal driving circuit 103, the writing scanning circuit 104, and the power supply scanning circuit 105 can also be mounted on a display panel (substrate) that forms the pixel array unit 102.

The writing scanning circuit 104 is configured by a shift register that sequentially shifts (transmits) start pulses sp in synchronization with a clock pulse ck or the like. The writing scanning circuit 104 supplies pulses (scanning signals) WS1 to WSm by sequentially writing the pulses into the scanning lines WSL-1 to WSL-m when a video signal is written into each pixel 101 of the pixel array unit 102, whereby sequentially scanning (line sequential scanning) the pixels 101 of the pixel array unit 102 in units of one row.

The power supply scanning circuit 105 is configured by a shift register that sequentially shifts the start pulses sp in synchronization with the clock pulse ck or the like. The power supply scanning circuit 105 selectively supplies power supply line electric potentials DS1 to DSm that are shifted between a first electric potential Vcc_H and a second electric potential Vcc_L lower than the first electric potential Vcc_H to the power supply lines DSL-1 to DSL-m in synchronization with line sequential scanning performed by the writing scanning circuit 104. Accordingly, the power supply scanning circuit 105 controls emission or non-emission of the pixels 101.

The horizontal driving circuit 103 appropriately selects either a signal voltage Vsig of a video signal (hereinafter, it may be also referred to as only a "signal voltage") corresponding to luminance information that is supplied from a signal supply source (not shown) or a signal line reference electric potential Vo so as to be written into the pixels 101 of the pixel array unit 102 through the signal lines DTL-1 to DTL-n, for example, in units of one row. In other words, the horizontal driving circuit 103 employs a driving form of the line sequential writing type in which a signal voltage Vin of a video signal is written in units of one row (line).

Here, the signal line reference electric potential Vo is a voltage (for example, a voltage corresponding to a black level) that becomes a reference for the signal voltage Vin of the video signal. In addition, the second electric potential Vcc_L is set to an electric potential that is lower than the signal line reference electric potential Vo, for example, an electric potential that is lower than "Vo−Vth" wherein a threshold voltage of a driving transistor is denoted by Vth. More preferably, the second voltage Vcc_L is set to an electric potential that is sufficiently lower than "Vo−Vth".

Pixel Circuit

Figure 2:
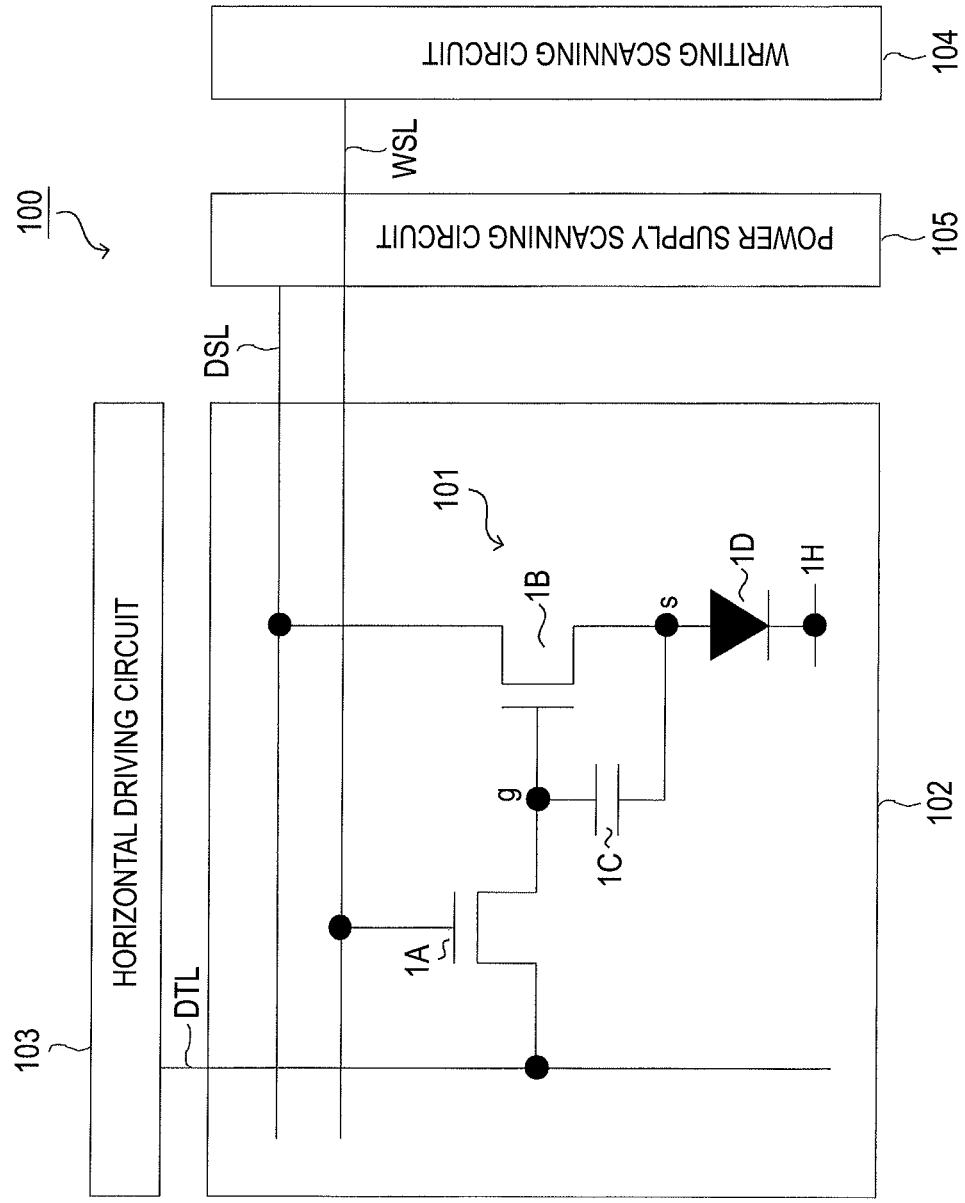
FIG. 2 is a circuit diagram representing a concrete example of the configuration of a pixel (pixel circuit).

FIG. 2 is a circuit diagram representing a concrete example of the configuration of the pixel (pixel circuit).

As shown in FIG. 2, the pixel 101 has a pixel configuration in which an electro-optical element of the current-driven type, in which the emission luminance changes in accordance with the value of a current flowing through the device, for example, an organic EL element 1D is included as a light emitting element, and a driving transistor 1B, a writing transistor 1A, and a holding capacitor 1C are included in addition to the organic EL element 1D. In other words, the pixel 101 has a 2Tr/1C pixel configuration that is configured by two transistors (Tr) and one capacitor (C).

In the pixel 101 having such a configuration, N-channel TFTs are used as the driving transistor 1B and the writing transistor 1A. However, the combination of conductive types of the driving transistor 1B and the writing transistor 1A described here is merely an example, and an embodiment of the invention is not limited to such a combination.

The organic EL element 1D has a cathode electrode connected to a common power supply line 1H that is wired commonly to all the pixels 101. The driving transistor 1B has a source electrode connected to the anode electrode of the organic EL element 1D and a drain electrode connected to the power supply lines DSL (DSL-1 to DSL-m).

The writing transistor 1A has a gate electrode connected to the scanning line WSL (WSL-1 to WSL-m), one electrode (a source electrode or a drain electrode) connected to the signal line DTL (DTL-1 to DTL-n), and the other electrode (the drain electrode or the source electrode) connected to the gate electrode of the driving transistor 1B.

The holding capacitor 1C has one electrode connected to the gate electrode of the driving transistor 1B and the other electrode connected to the source electrode of the driving transistor 1B (the anode electrode of the organic EL element 1D). In addition, an auxiliary capacitor 1J has one electrode connected to the anode electrode of the organic EL element 1D and the other electrode connected to the cathode electrode of the organic EL element 1D.

In the pixel 101 having the 2Tr/1C pixel configuration, the writing transistor 1A is in a conducting state in response to a scanning signal WS applied to the gate electrode from the writing scanning circuit 104 through the scanning line WSL. Accordingly, the writing transistor 1A samples a signal voltage Vin of a video signal corresponding to the luminance information supplied from the horizontal driving circuit 103 or the signal line reference electric potential Vo through the signal line DTL so as to be written into the pixel 101.

The written signal voltage Vin or the signal line reference electric potential Vo is applied to the gate electrode of the driving transistor 1B, and is maintained in the holding capacitor 1C. When the electric potential DS of the power supply line DSL (DSL-1 to DSL-m) is the first potential Vcc_H, the driving transistor 1B is supplied with a current from the power supply line DSL and supplies a driving current having a current value corresponding to the voltage value of the signal voltage Vin maintained in the holding capacitor 1C to the organic EL element 1D, whereby driving the organic EL element 1D by the current so as to emit light.

Circuit Operation of Organic EL Display Device

Next, the circuit operation of the organic EL display device 100 having the above-described configuration will be described based on a timing waveform chart represented in FIG. 3 with reference to operation explanatory diagrams represented in FIGS. 4A to 6C. Incidentally, in the operation explanatory diagrams represented in FIGS. 4A to 6C, the writing transistor 1A is denoted by the symbol of a switch in order to simplify the drawings. In addition, since the organic EL element 1D has a capacitance component, an EL capacitance 1I is also shown in the diagrams.

Figure 3:
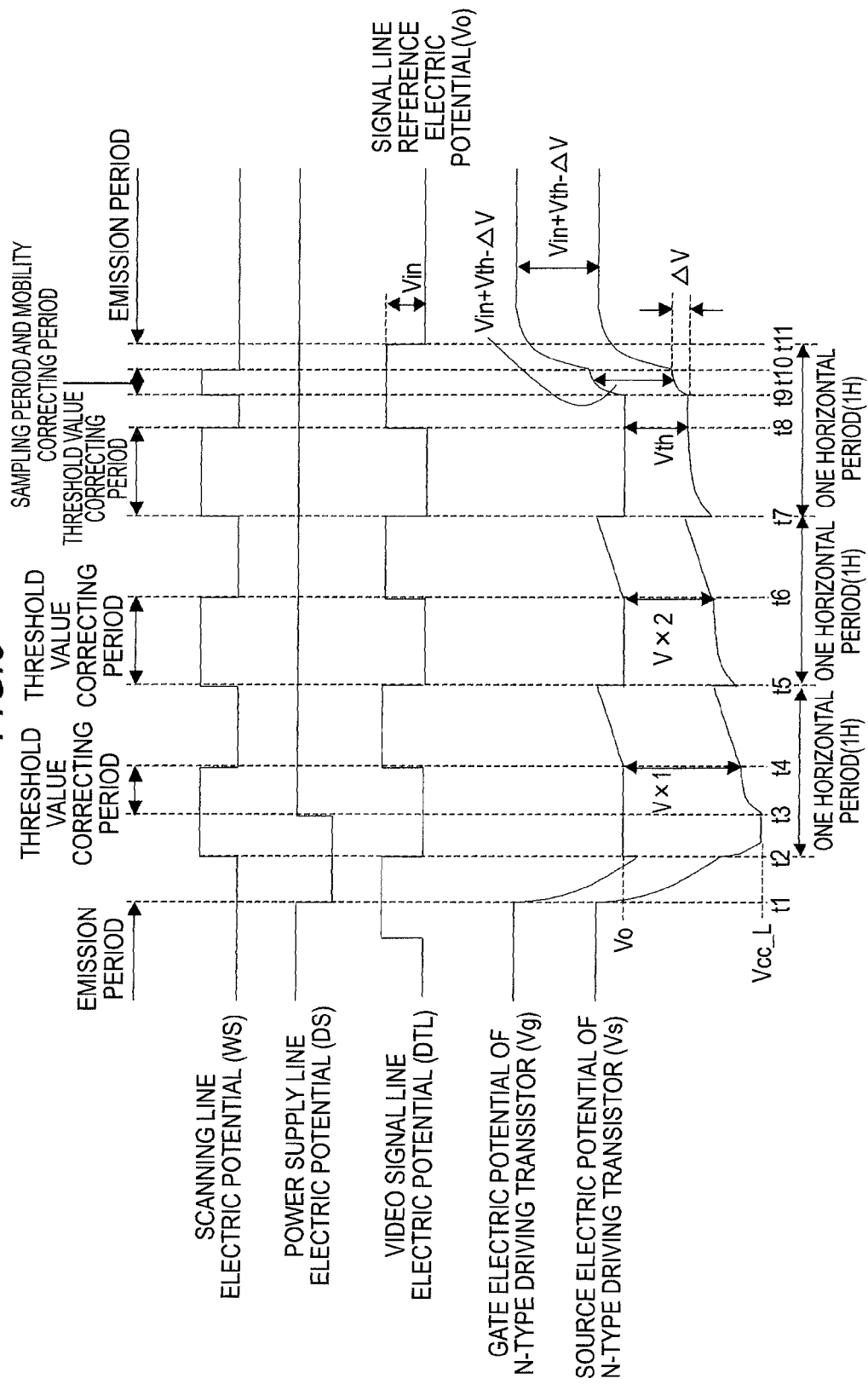
FIG. 3 is a timing waveform chart for illustrating the operation of an organic EL display device of the active matrix type that serves as a premise of an embodiment of the invention.

The timing waveform chart represented in FIG. 3 shows changes in the electric potential (writing pulse) WS of the scanning line WSL (WSL-1 to WSL-m), changes in the electric potential DS (Vcc_H and Vcc_L) of the power supply line DSL (DSL-1 to DSL-m), and changes in the gate electric potential Vg and the source electric potential Vs of the driving transistor 1B.

Emission Period

The organic EL element 1D is in a light emitting state before time t1 in the timing waveform chart of FIG. 3 (emission period). During this emission period, the electric potential DS of the power supply line DSL is the first electric potential Vcc_H, and the writing transistor 1A is in a non-conducting state.

Figure 4A:
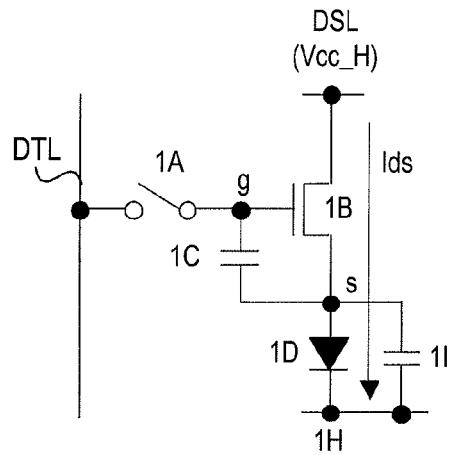
FIGS. 4A to 4D are explanatory diagrams (first example) illustrating the circuit operation of an organic EL display device of the active matrix type that serves as a premise of an embodiment of the invention.

At this moment, since the driving transistor 1B is set to operate in a saturation region, as shown in FIG. 4A, a driving current (drain-to-source current) Ids corresponding to the gate-to-source voltage Vgs of the driving transistor 1B is supplied from the power supply line DSL through the driving transistor 1B to the organic EL element 1D. Accordingly, the organic EL element 1D emits light at a luminance level corresponding to the value of the current of the driving current Ids.

Threshold Value Correction Preparatory Period

Figure 4B:
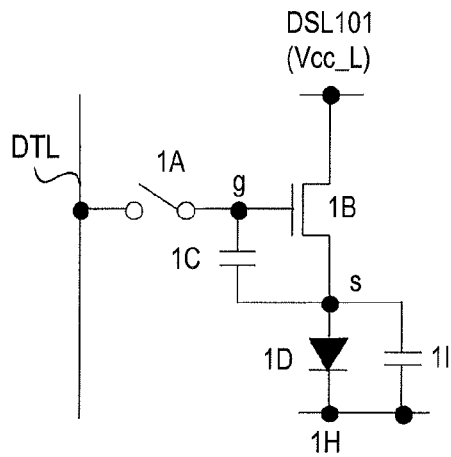

Then, a new field of line-sequential scanning begins at time t1. Thus, as shown in FIG. 4B, the electric potential DS of the power supply line DSL changes from the first electric potential (hereinafter referred to as a "high electric potential") Vcc_H to the second electric potential (hereinafter, referred to as a "low electric potential") Vcc_L that is sufficiently lower than the signal line reference voltage Vo-Vth of the signal line DTL.

Here, letting Vel be the threshold voltage of the organic EL element 1D and Vcath be the electric potential of the common power supply line 1H, when the low electric potential Vcc_L satisfies the relation of Vcc_L<Vel+Vcath, the source electric potential Vs of the driving transistor 1B is substantially equal to the low electric potential Vcc_L, and thus the organic EL element 1D is set to be in a reverse-biased state and quenched.

Figure 4C:
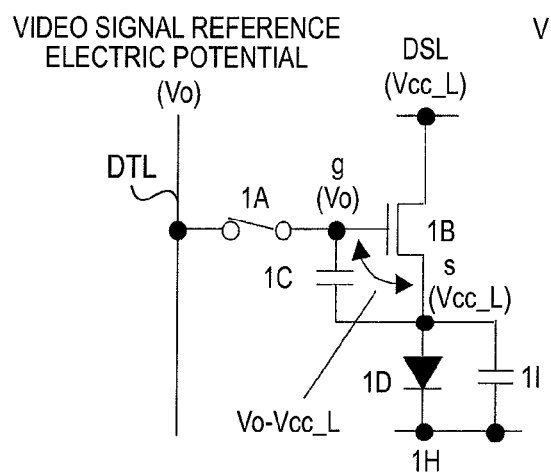

Next, at time t2, as the electric potential WS of the scanning line WSL makes a transition from a low electric potential side to a high electric potential side, as shown in FIG. 4C, the writing transistor 1A is set in a conducting state. At this moment, since the signal line reference electric potential Vo is supplied from the horizontal driving circuit 103 to the signal line DTL, the gate electric potential Vg of the driving transistor 1B becomes the signal line reference electric potential Vo. The source electric potential Vs of the driving transistor 1B is the electric potential Vcc_L that is sufficiently lower than the signal line reference electric potential Vo.

At this moment, the gate-to-source voltage Vgs of the driving transistor 1B is Vo−Vcc_L. Here, when Vo−Vcc_L is not higher than the threshold voltage Vth of the driving transistor 1B, a threshold value correcting operation to be described later may not be performed. Accordingly, the electric potential relation may need to be set such that Vo−Vcc_L>Vth. As described above, an initialization operation of respectively fixing (determining) the gate electric potential Vg and the source electric potential Vs of the driving transistor 1B to the signal line reference electric potential Vo and the low electric potential Vcc_L is a threshold value correction preparatory operation.

Threshold Value Correcting Period for First Time

Figure 4D:
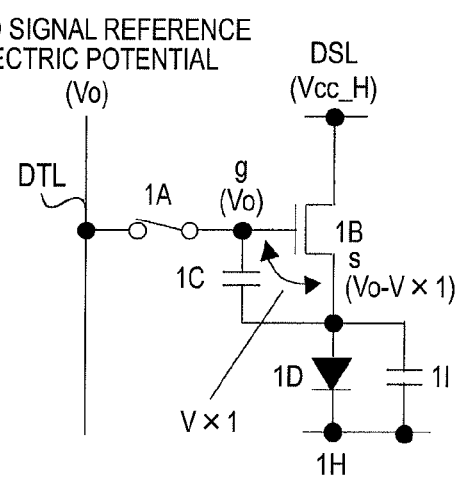

Next, as shown in FIG. 4D, when the electric potential DS of the power supply line DSL shifts from the low electric potential Vcc_L to the high electric potential Vcc_H at time t3, the source electric potential Vs of the driving transistor 1B starts to rise, and a threshold value correcting period for the first time starts. During the threshold value correcting period for the first time, the source electric potential Vs of the driving transistor 1B rises. Accordingly, the gate-to-source voltage Vgs of the driving transistor 1B becomes a predetermined electric potential Vx1, and the electric potential Vx1 is maintained at the holding capacitor 1C.

Figure 5A:
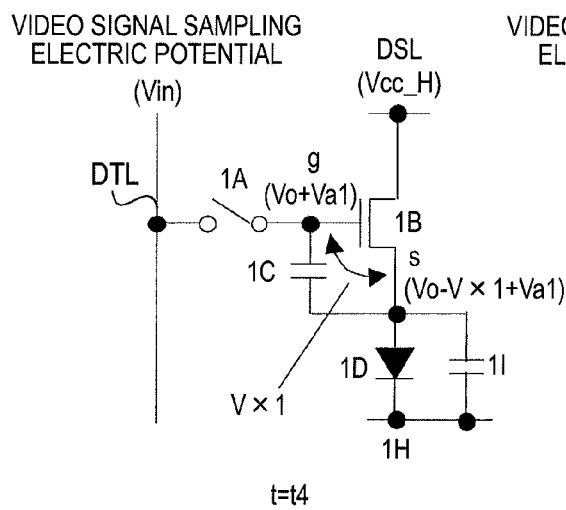
FIGS. 5A to 5D are explanatory diagrams (second example) illustrating the circuit operation of an organic EL display device of the active matrix type that serves as a premise of an embodiment of the invention.

Subsequently, at time t4 that is start of a latter part of the horizontal period (1H), as shown in FIG. 5A, the signal voltage Vin of the video signal is supplied to the signal line DTL from the horizontal driving circuit 103, whereby the electric potential of the signal line DTL makes a transition from the signal line reference electric potential Vo to the signal voltage Vin. During this period, writing signal voltages Vin into pixels of another row is performed.

At this moment, in order not to write the signal voltage Vin into pixels of the current row, the electric potential WS of the scanning line WSL is allowed to make a transition from the high electric potential side to the low electric potential side, whereby the writing transistor 1A is to be in a non-conducting state. Accordingly, the gate electrode of the driving transistor 1B is cut off from the signal line DTL to be in a floating state.

Here, when the gate electrode of the driving transistor 1B is in the floating state, the holding capacitor 1C is connected between the gate and the source of the driving transistor 1B. Thus, when the source electric potential Vs of the driving transistor 1B changes, the gate electric potential Vg of the driving transistor 1B also changes in accordance (follow) with the change in the source electric potential Vs. This is a bootstrap operation that is performed by the holding capacitor 1C.

Also after time t4, the source electric potential Vs of the driving transistor 1B continues to rise so as to rise by Va1 (Vs=Vo−Vx1+Va1). At this moment, the gate electric potential Vg also rises by Va1 in accordance with the rise in the source electric potential Vs of the driving transistor 1B by the bootstrap operation (Vg=Vo+Va1).

Threshold Value Correcting Period for Second Time

Figure 5B:
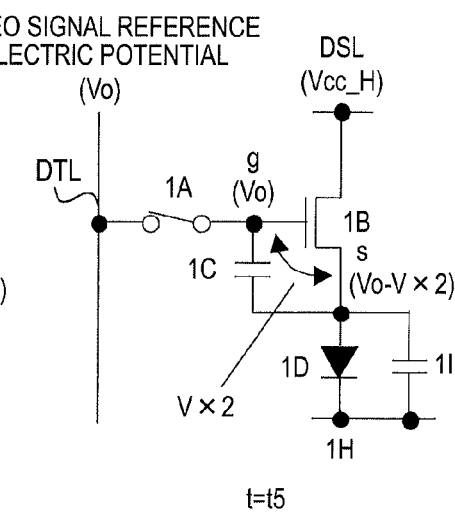

When the next horizontal period begins at time t5, as shown in FIG. 5B, the electric potential WS of the scanning line WSL shifts from the low electric potential side to the high electric potential side, and the writing transistor 1A is in the conducting state. Simultaneously, the signal line reference electric potential Vo instead of the signal voltage Vin is supplied to the signal line DTL from the horizontal driving circuit 103, and a threshold value correcting period for the second time begins.

During the threshold value correcting period for the second time, the writing transistor 1A is in the conducting state, and thus the signal line reference electric potential Vo is written. Accordingly, the gate electric potential Vg of the driving transistor 1B is initialized back to the signal line reference electric potential Vo. The source electric potential Vs drops in accordance with a drop in the gate electric potential Vg at that moment. Then, again, the source electric potential Vs of the driving transistor 1B starts to rise.

Then, as the source electric potential Vs of the driving transistor 1B rises during the threshold value correcting period for the second time, the gate-to-source voltage Vgs of the driving transistor 1B becomes a predetermined electric potential Vx2, and this electric potential Vx2 is maintained in the holding capacitor 1C.

Figure 5C:
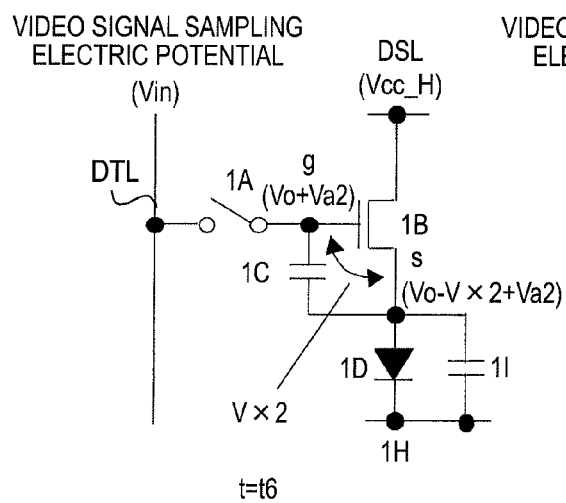

Subsequently, at time t6 when a latter part of this horizontal period begins, as shown in FIG. 5C, as the signal voltage Vin of the video signal is supplied from the horizontal driving circuit 103 to the signal line DTL, the electric potential of the signal line DTL is allowed to make a transition from the offset voltage Vo to the signal voltage Vin. During this period, the signal voltage Vin is written into pixels of another row (the next row of the row being written at the previous time).

At this moment, in order not to perform writing the signal voltage Vin into the pixels of the current row, the electric potential WS of the scanning line WSL is allowed to make a transition from the high electric potential side to the low electric potential side, whereby the writing transistor 1A is in the non-conducting state. Accordingly, the gate electrode of the driving transistor 1B is cut off from the signal line DTL to be in a floating state.

Also after time t6, the source electric potential Vs of the driving transistor 1B continues to rise so as to rise by Va2 (Vs=Vo−Vx1+Va2). At this moment, by the bootstrap operation, the gate electric potential Vg rises by Va2 in accordance with a rise in the source electric potential Vs of the driving transistor 1B (Vg=Vo+Va2).

Threshold Value Correcting Period for Third Time

Figure 5D:
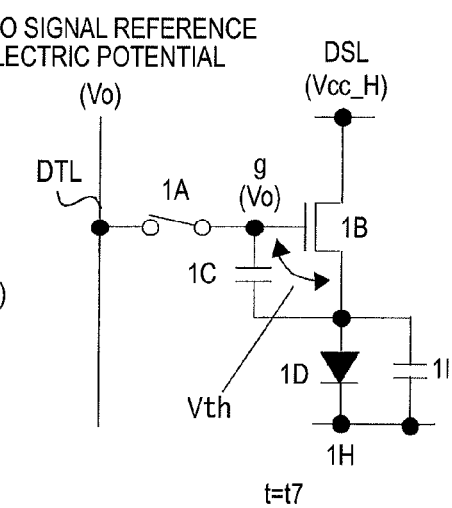

The next horizontal period begins at time t7, and, as shown in FIG. 5D, the electric potential WS of the scanning line WSL is allowed to make a transition from the low electric potential side to the high electric potential side, whereby the writing transistor 1A is in the conducting state. Simultaneously, the signal line reference electric potential Vo instead of the signal voltage Vin is supplied to the signal line DTL from the horizontal driving circuit 103, and a threshold value correcting period for the third time begins.

During this threshold value correcting period for the third time, as the writing transistor 1A is in the conducting state, the signal line reference electric potential Vo is written. Accordingly, the gate electric potential Vg of the driving transistor 1B is reinitialized to the signal line reference electric potential Vo. In accordance with a drop in the gate electric potential Vg at that moment, the source electric potential Vs drops. Then, the source electric potential Vs of the driving transistor 1B starts to rise again.

As the source electric potential Vs of the driving transistor 1B rises, finally, the gate-to-source voltage Vgs of the driving transistor 1B converges at the threshold voltage Vth of the driving transistor 1B, whereby a voltage corresponding to the threshold voltage Vth is maintained in the holding capacitor 1C.

By performing the above-described threshold value correcting operations for three times, the threshold voltage Vth of the driving transistor 1B of each pixel is detected, and a voltage corresponding to the threshold voltage Vth is maintained in the holding capacitor 1C. In addition, during the threshold value correcting period for the three times, in order to allow a current to flow not to the organic EL element 1D side but only to the holding capacitor 1C side, the electric potential Vcath of the common power supply line 1H is set such that the organic EL element 1D is in the cut-off state.

Signal Writing Period and Mobility Correcting Period

Figure 6A:
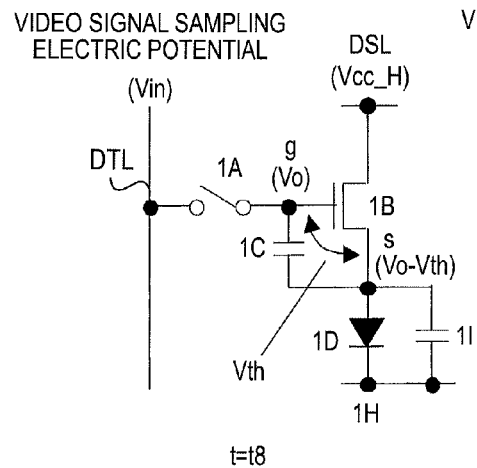
FIGS. 6A to 6C are explanatory diagrams (third example) illustrating the circuit operation of an organic EL display device of the active matrix type that serves as a premise of an embodiment of the invention.

Next, at time t8, as the electric potential WS of the scanning line WSL is allowed to make a transition to the low electric potential side, as shown in FIG. 6A, the writing transistor 1A is in the non-conducting state. Simultaneously, the electric potential of the signal line DTL is shifted from the offset voltage Vo to the signal voltage Vin of the video signal.

As the writing transistor 1A is in the non-conducting state, the gate electrode of the driving transistor 1B is in a floating state. However, since the gate-to-source voltage Vgs is equal to the threshold voltage Vth of the driving transistor 1B, the driving transistor 1B is in the cut-off state. Accordingly, a drain-to-source current Ids does not flow in the driving transistor 1B.

Figure 6B:
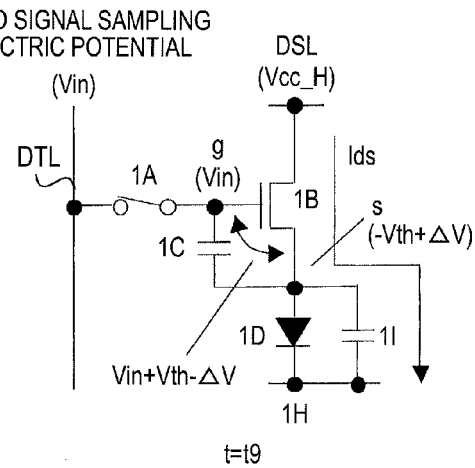

Subsequently, at time t9, as the electric potential WS of the scanning line WSL is allowed to make a transition to the high electric potential side, as shown in FIG. 6B, the writing transistor 1A is in the conducting state. Thus, the signal voltage Vin of the video signal is sampled so as to be written into the pixel 101. By writing the signal voltage Vin by using the writing transistor 1A, the gate electric potential Vg of the driving transistor 1B becomes the signal voltage Vin.

Then, when the driving transistor 1B is driven in accordance with the signal voltage Vin of the video signal, the threshold voltage Vth of the driving transistor 1B is offset by the threshold voltage Vth maintained in the holding capacitor 1C, whereby the threshold value correction is performed.

At this moment, since the organic EL element 1D is in the first cutoff state (high impedance state), a current (drain-to-source current Ids) flowing from the power supply line DSL to the driving transistor 1B in accordance with the signal voltage Vin of the video signal flows in the EL capacitance 1I of the organic EL element 1D, whereby charging of the EL capacitance 1I is started.

By charging the EL capacitance 1I, the source electric potential Vs of the driving transistor 1B rises over time. At this moment, since the deviation of the threshold voltage Vth of the driving transistor 1B has been already corrected (corrected for the threshold value), the drain-to-source current Ids of the driving transistor 1B depends on the mobility μ of the driving transistor 1B.

Finally, when the source electric potential Vs of the driving transistor 1B rises up to the electric potential of "Vo−Vth+ΔV", the gate-to-source voltage Vgs of the driving transistor 1B becomes "Vin+Vth−ΔV". In other words, an increase amount ΔV of the source electric potential Vs acts to be subtracted from the voltage (Vin+Vth−ΔV) maintained in the holding capacitor 1C, that is, to discharge electric charges charged in the holding capacitor 1C for applying a negative feedback. Accordingly, the increase amount ΔV of the source electric potential Vs becomes the feedback amount of the negative feedback.

As described above, by applying the drain-to-source current Ids flowing through the driving transistor 1B to the gate input of the driving transistor 1B, that is, the gate-to-source voltage Vgs as a negative feedback, mobility correction, in which the dependence of the drain-to-source current Ids of the driving transistor 1B on the mobility μ is eliminated, in other words, the deviation of the mobility μ for each pixel is corrected, is performed.

In particular, the higher the signal voltage Vin of the video signal is, the larger the drain-to-source current Ids becomes, and thus the absolute value of the feedback amount (correction amount) ΔV of the negative feedback is increased. Accordingly, the mobility correction is performed in accordance with the emission luminance level. In addition, when the signal voltage Vin of the video signal is constant, the absolute value of the feedback amount ΔV for the negative feedback is increased as the mobility μ of the driving transistor 1B is higher. Accordingly, the deviation of the mobility μ for each pixel can be eliminated.

Emission Period

Figure 6C:
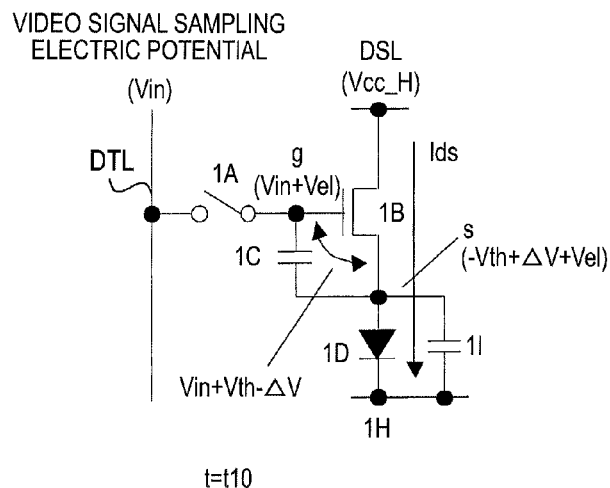

Next, at time t10, as the electric potential WS of the scanning line WSL makes a transition to the low electric potential side as shown in FIG. 6C, the writing transistor 1A is in a non-conducting state. Accordingly, the gate electrode of the driving transistor 1B is cut off from the signal line DTL so as to be in a floating state.

As the gate electrode of the driving transistor 1B is in the floating state, and simultaneously, the drain-to-source current Ids of the driving transistor 1B starts to flow through the organic EL element 1D, the anode electric potential of the organic EL element 1D rises in accordance with the drain-to-source current Ids of the driving transistor 1B.

The rise in the anode electric potential of the organic EL element 1D is not different from a rise in the source electric potential Vs of the driving transistor 1B. As the source electric potential Vs of the driving transistor 1B rises, the gate electric potential Vg of the driving transistor 1B also rises by the bootstrap operation of the holding capacitor 1C.

At this time, assuming that a bootstrap gain is one (ideal value), the amount of the rise in the gate electric potential Vg is equal to that in the source electric potential Vs. Thus the gate-to-source voltage Vgs of the driving transistor 1B is maintained to be constant at Vin+Vth−ΔV during the emission period. Then, at time t11, the electric potential of the signal line DTL shifts from the signal voltage Vin of the video signal to the signal line reference electric potential Vo.

As is apparent from the description of the operation as above, in this example, the threshold value correcting period is set to be over a total of 3H periods including a 1H period, in which signal writing and mobility correction are performed, and 2H periods that precedes the 1H period. Accordingly, a sufficient time can be acquired as the threshold value correcting period. Therefore, the threshold voltage Vth of the driving transistor 1B can be correctly detected and maintained in the holding capacitor 1C, whereby the threshold value correcting operation can be assuredly performed.

Here, the threshold value correcting period is set over the 3H periods. However, this is only an example. Thus, as long as a sufficient time can be acquired by a 1H period, in which signal writing and mobility correction are performed, as the threshold value correcting period, the threshold value correcting period may not need to be set over the preceding horizontal periods. On the other hand, when it is difficult to acquire a sufficient time by setting the threshold value correcting period to be over 3H periods in a case where a 1H period is shortened in accordance with an increase in the precision, the threshold value correcting period may be set over 4H periods or more.

2. Problem in Pixel Structure in Related Art

Pixel Circuit

Figure 7:
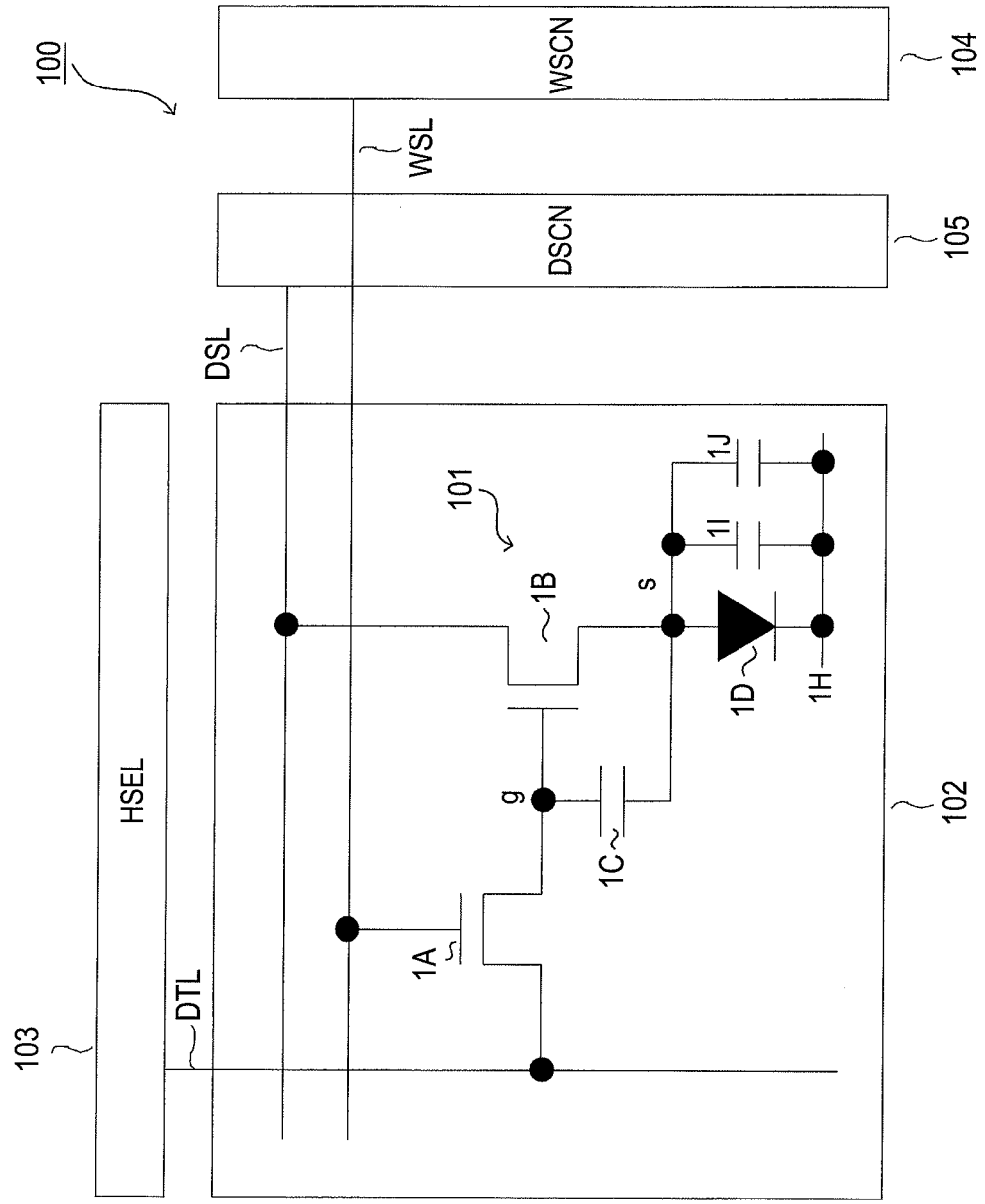
FIG. 7 is a circuit diagram representing a pixel structure in related art.

FIG. 7 is a circuit diagram representing a pixel structure in related art. A pixel 101 includes an organic EL element 1D, a driving transistor 1B, a writing transistor 1A, a holding capacitor 1C, and an auxiliary capacitor 1J.

More specifically, the anode electrode of the organic EL element 1D and the source electrode of the driving transistor 1B are connected together, and the gate electrode of the driving transistor 1B and the source electrode or the drain electrode of the writing transistor 1A are connected together. In addition, the holding capacitor 1C is connected between the gate and the source electrode of the driving transistor 1B. In addition, the auxiliary capacitor 1J is connected between the anode electrode and the cathode electrode of the organic EL element 1D. In addition, parasitic capacitance 1I is formed in the organic EL element 1D.

A signal line DTL is connected to the drain electrode or the source electrode of the writing transistor 1A. In addition, to the gate electrode of the writing transistor 1A, a scanning line WSL is connected, and a predetermined timing is given. A power supply line DSL is connected to the drain electrode of the driving transistor 1B.

Layout of Pixel Circuit

Figure 8:
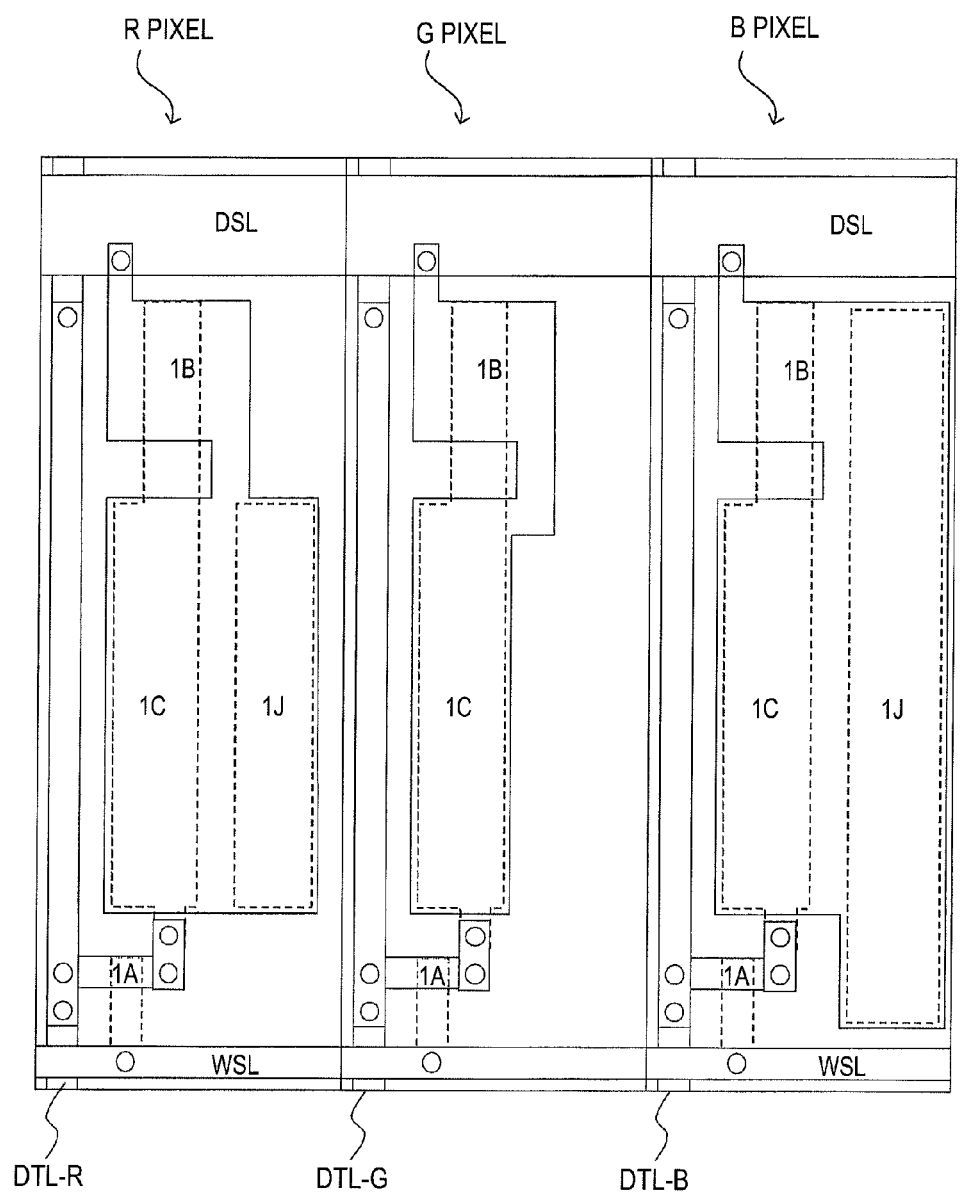
FIG. 8 is a schematic plan view illustrating a pixel structure in related art.

FIG. 8 is a schematic plan view illustrating a pixel structure in related art. FIG. 8 represents the disposition configuration of an R (red) pixel, a G (green) pixel, and a B (blue) pixel. Each pixel is configured between the power supply line DSL and the scanning line WSL that extend in the horizontal direction (horizontal direction in the figure), and areas of the RGB pixels are partitioned by signal lines DTL that extend in the vertical direction (the vertical direction in the figure).

Within the area of each pixel, a writing transistor 1A, a driving transistor 1B, and a holding capacitor 1C are disposed. In addition, an auxiliary capacitor 1J that is used for adjusting writing gain or mobility correcting time is also disposed.

In the example represented in FIG. 8, a case is shown where the pattern density of the G (green) pixel is lower than that of the R (red) pixel, and the pattern density of the B (blue) pixel is higher than that of the R (red) pixel. In a pixel having a high pattern density, wiring interval is short, whereby a defective pattern or the like may be easily generated.

Figure 9:
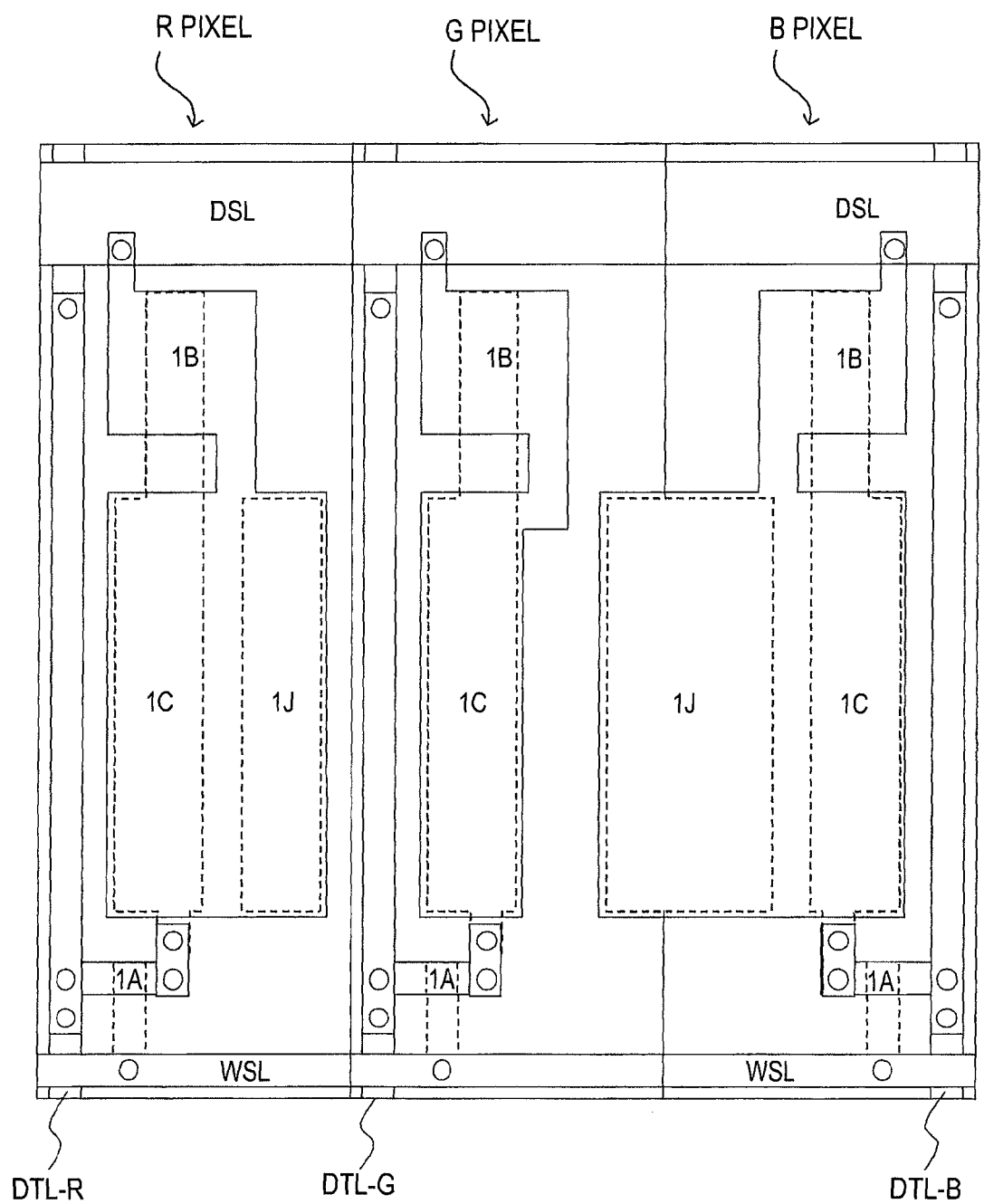
FIG. 9 is a schematic plan view illustrating the pixel structure that solves a problem in the pattern density.

FIG. 9 is a schematic plan view illustrating the pixel structure that solves the problem in the pattern density. In this layout, the B (blue) pixel having a high pixel density is disposed so as to be reversed in the horizontal direction with respect to the layout represented in FIG. 8. Accordingly, in an area between the B (blue) pixel and the G (green) pixel, a signal line ETL-B is not disposed, and the auxiliary capacitor 1J of the B (blue) pixel is set in from the above-described area to the area of the G (green) pixel.

Figure 10:
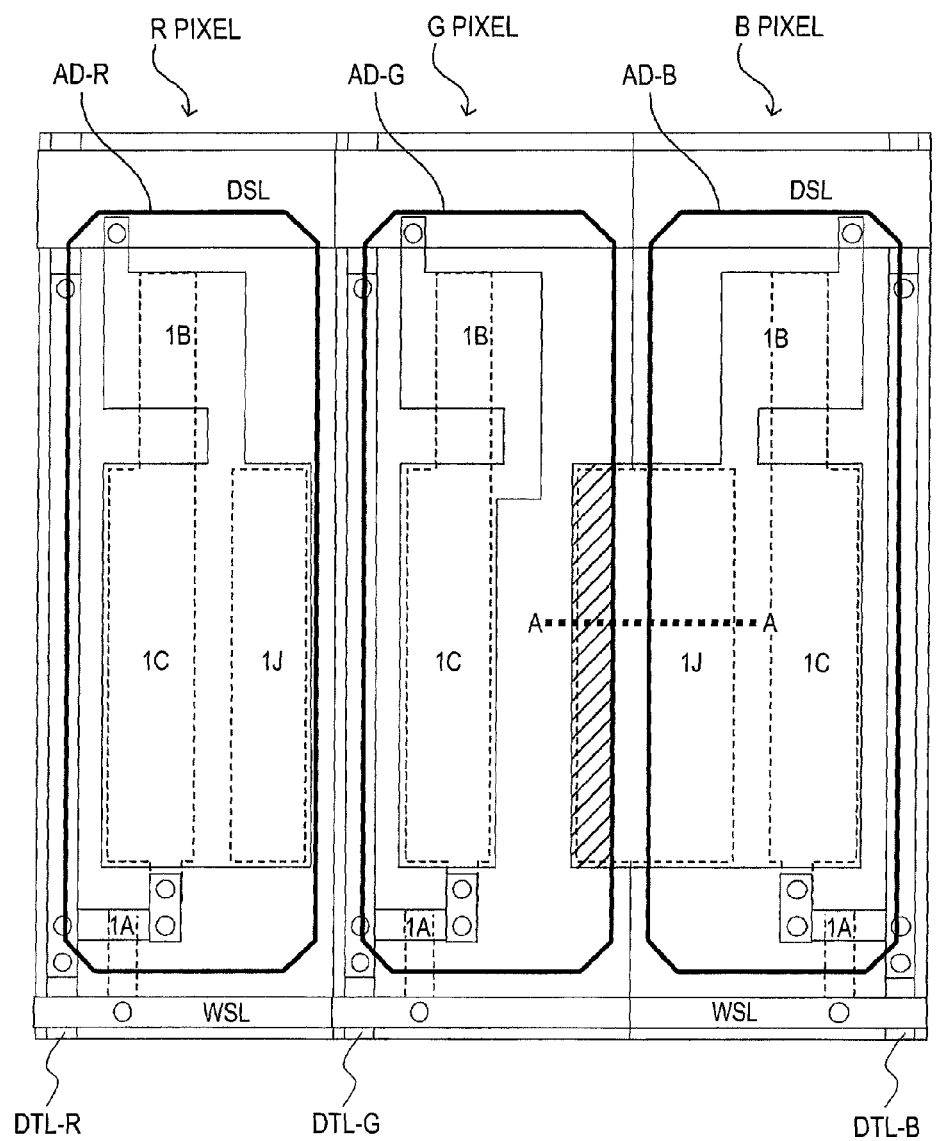
FIG. 10 is a schematic plan view of a layout that is acquired by adding anode electrodes to the layout represented in FIG. 9.

FIG. 10 is a schematic plan view of a layout that is acquired by adding anode electrodes to the layout represented in FIG. 9. The anode electrode AD is denoted by a thick solid line in the figure and is formed so as to cover each pixel. Here, the patterns of the writing transistors 1A or the driving transistors 1B of the RGB pixels are asymmetric to one another. However, the anode electrodes AD are formed to be symmetric for allowing the aperture ratio of the organic EL element 1D to be uniform. Accordingly, below the anode electrode AD-G of the G (green) pixel, a part of the auxiliary capacitor 1J of the B (blue) pixel is disposed. In addition, an area denoted by diagonal lines in the figure forms a parallel plate capacitor that is configured by the anode electrode AD-G of the G (green) pixel and an upper electrode of the auxiliary capacitor 1J of the B (blue) pixel.

Figure 11:
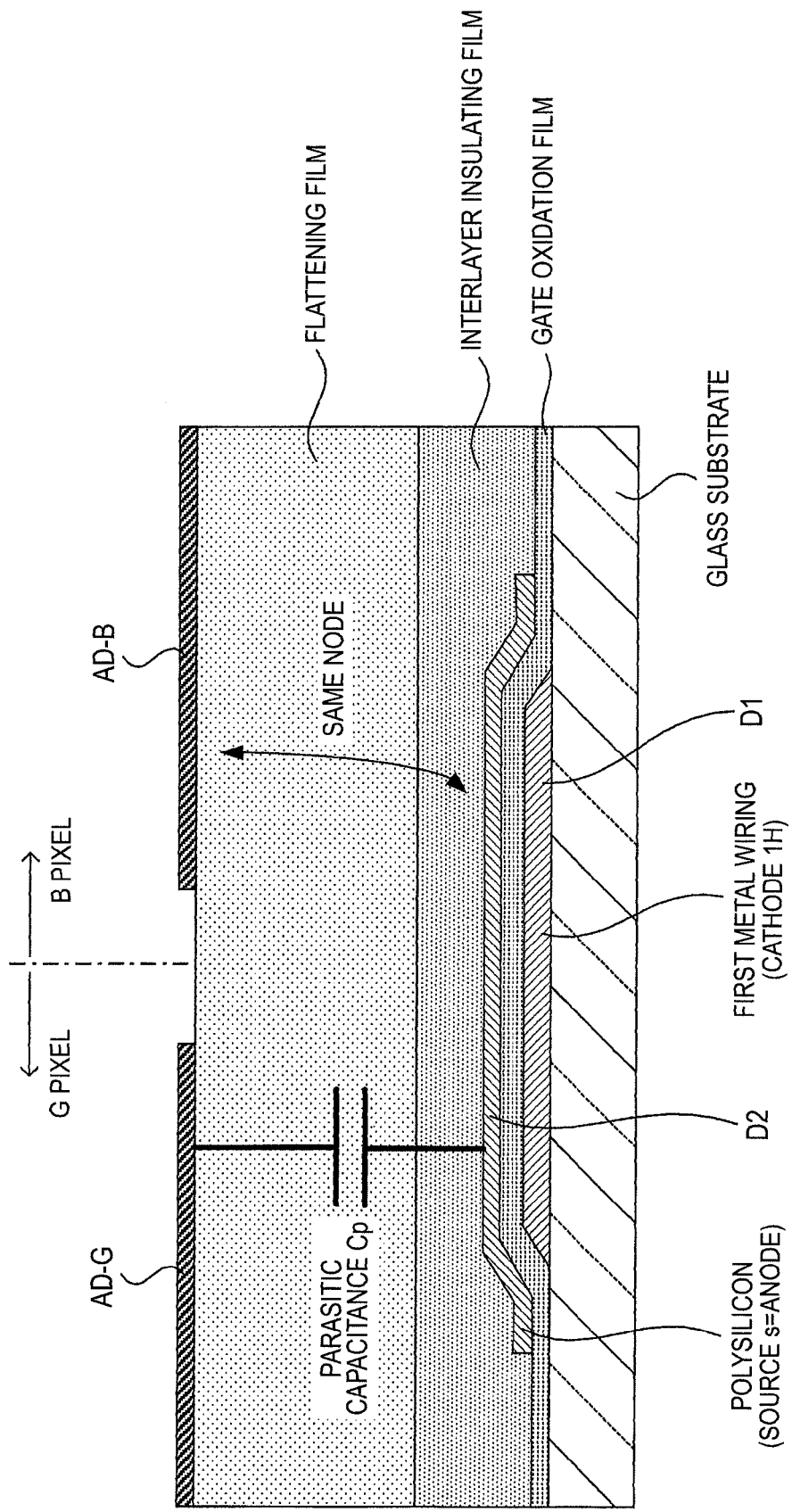
FIG. 11 is a cross-sectional view taken along line A-A shown in FIG. 10.

FIG. 11 is a schematic cross-sectional view taken along line A-A shown in FIG. 10. In the auxiliary capacitor 1J of the B (blue) pixel, a cathode 1H is set in a first metal wiring that becomes a lower electrode D1, and a source s of the driving transistor 1B, that is, an anode is set in polysilicon that becomes an upper electrode D2. As a result, the anode of the G (green) pixel and the anode of the B (blue) pixel configure a parallel plate, whereby parasitic capacitance Cp is formed.

Circuit Diagram Illustrating Parasitic Capacitance

Figure 12:
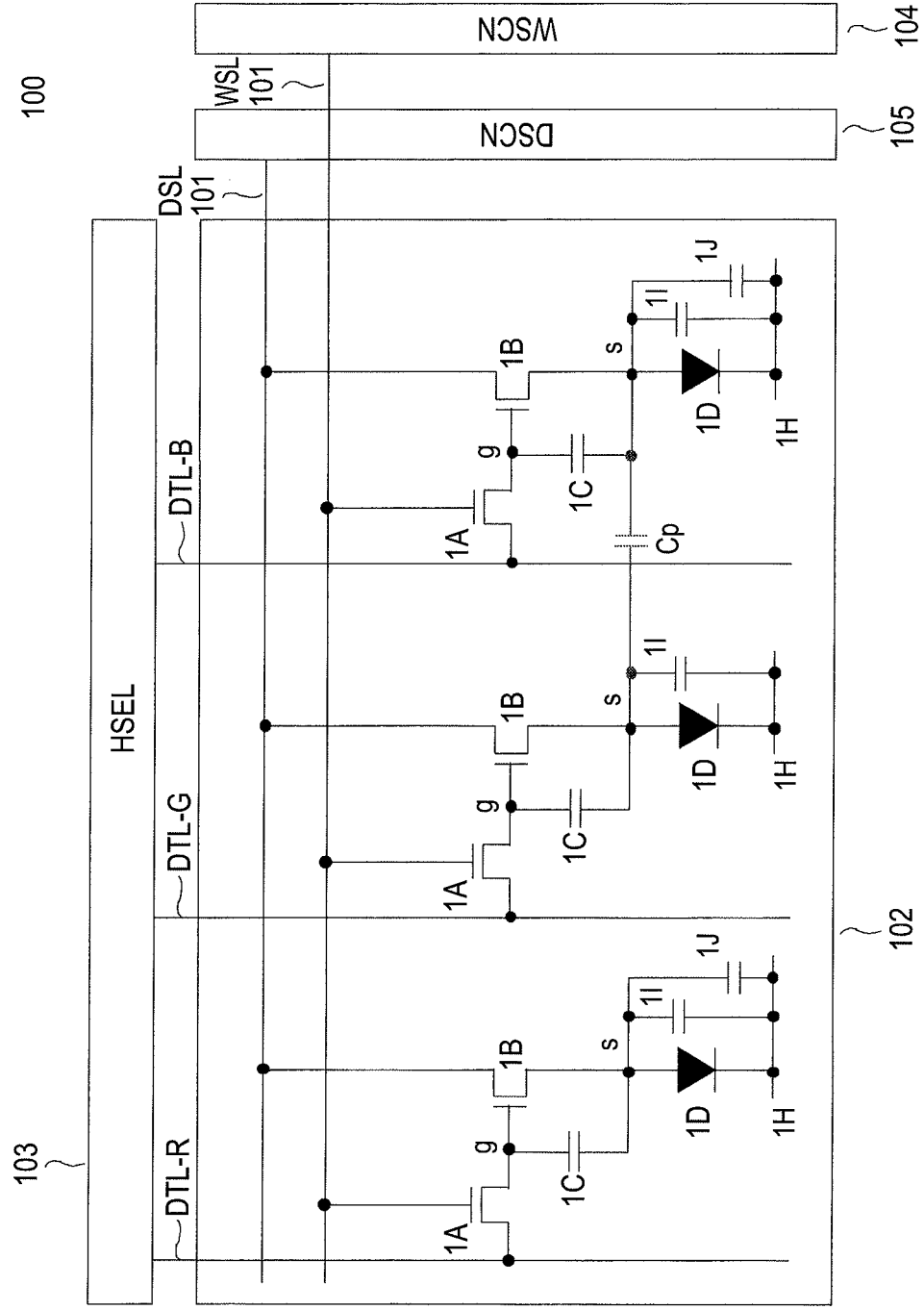
FIG. 12 is a circuit diagram illustrating parasitic capacitance.

FIG. 12 is a circuit diagram illustrating the parasitic capacitance. The signal line DTL is connected to the writing transistor 1A, and the source electrode or the drain electrode of the writing transistor 1A is connected to the gate electrode (node g) of the driving transistor 1B.

To the drain electrode of the driving transistor 1B, the power supply line DSL is connected, and the holding capacitor 1C is connected between the gate electrode and the source electrode. The source electrode (source s) of the driving transistor 1B is connected to the anode electrode of the organic EL element 1D. Between the anode electrode and the cathode electrode (cathode 1H) of the organic EL element 1D, the auxiliary capacitor 1J is connected. In addition, between the anode electrode and the cathode electrode of the organic EL element 1D, parasitic capacitance 1I of the organic EL element 1D is configured.

As described above, since the auxiliary capacitor 1J of the B (blue) pixel is set in the area of the G (green) pixel, parasitic capacitance Cp is formed between the anode of the G (green) pixel and the upper electrode (anode) of the auxiliary capacitor 1J of the B (blue) pixel.

Timing Chart

Figure 13:
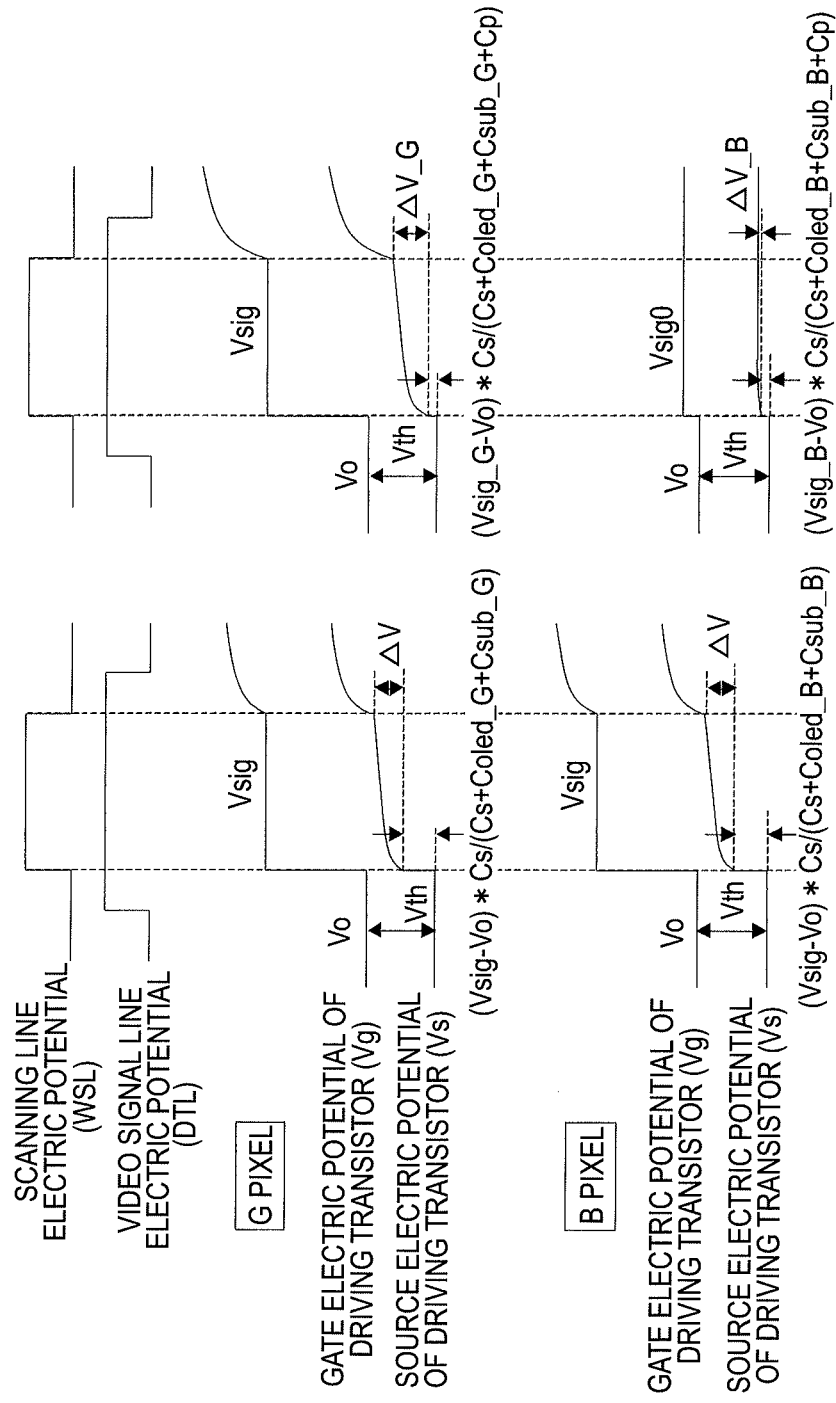
FIGS. 13A and 13B are timing charts illustrating the operation performed during a sampling period of a video signal and a mobility correcting period.

FIGS. 13A and 13B are timing charts illustrating the operation performed during a sampling period of a video signal and a mobility correcting period. Here, a change in the emission luminance of the G (green) pixel due to a difference in a sampling electric potential (emission luminance) of the B (blue) pixel will be described.

FIG. 13A represents the appearance of a change in the electric potential in a case where a same video signal electric potential Vsig is written into the G pixel and the B pixel so as to be in a same driving state. When the same video signal electric potential Vsig is written, a rise in the electric potential of the source s of the driving transistor 1B of the G pixel, that is, the anode due to capacitive coupling, which occurs at the time when the video signal is written, can be represented as the following Expression (1).

$$(Vsig-Vo) \times Cs/(Cs+Coled\_G+Csub\_G) \quad (1)$$

Accordingly, the rise in the electric potential of the source of the driving transistor 1B of the G pixel is not influenced by the parasitic capacitance Cp.

FIG. 13B represents a state in which the video signal electric potential Vsig that is the same as that represented in FIG. 13A is written into the G pixel, and a video signal electric potential Vsig0 is written in the B pixel. Here, it is assumed that Vsig>>Vsig0 and Vsig0 is a gray scale representing a color close to black. When these video signal electric potentials are written into the pixels, a rise in the electric potential of the source s of the N-type driving transistor 1B of the G pixel, that is, the anode due to capacitive coupling, which occurs at the time when the video signals are written, can be represented as the following Expression (2).

$$(Vsig-Vo) \times Cs/(Cs+Coled\_G+Csub\_G+Cp) \quad (2)$$

Accordingly, the rise in the electric potential of the source of the N-type driving transistor 1B of the G pixel is influenced by the parasitic capacitance Cp.

As a result, the relation of "Expression (1)">"Expression (2)" is satisfied. Thus, in a case where the B pixel located adjacent to the G pixel has a high gray scale, the gate-to-source voltage of the driving transistor 1B decreases so as to decrease the luminance when the video signal is written. As described above, when anodes of adjacent pixels form parasitic capacitance, there is influence of one pixel on the other pixel.

In this embodiment, the influence of a change in the video signal electric potential of one pixel of adjacent pixels on the luminance of the other pixel due to formation of parasitic capacitance between anodes of the adjacent pixels, as described above, can be prevented.

3. Configuration Example of this Embodiment

System Configuration

Figure 14:
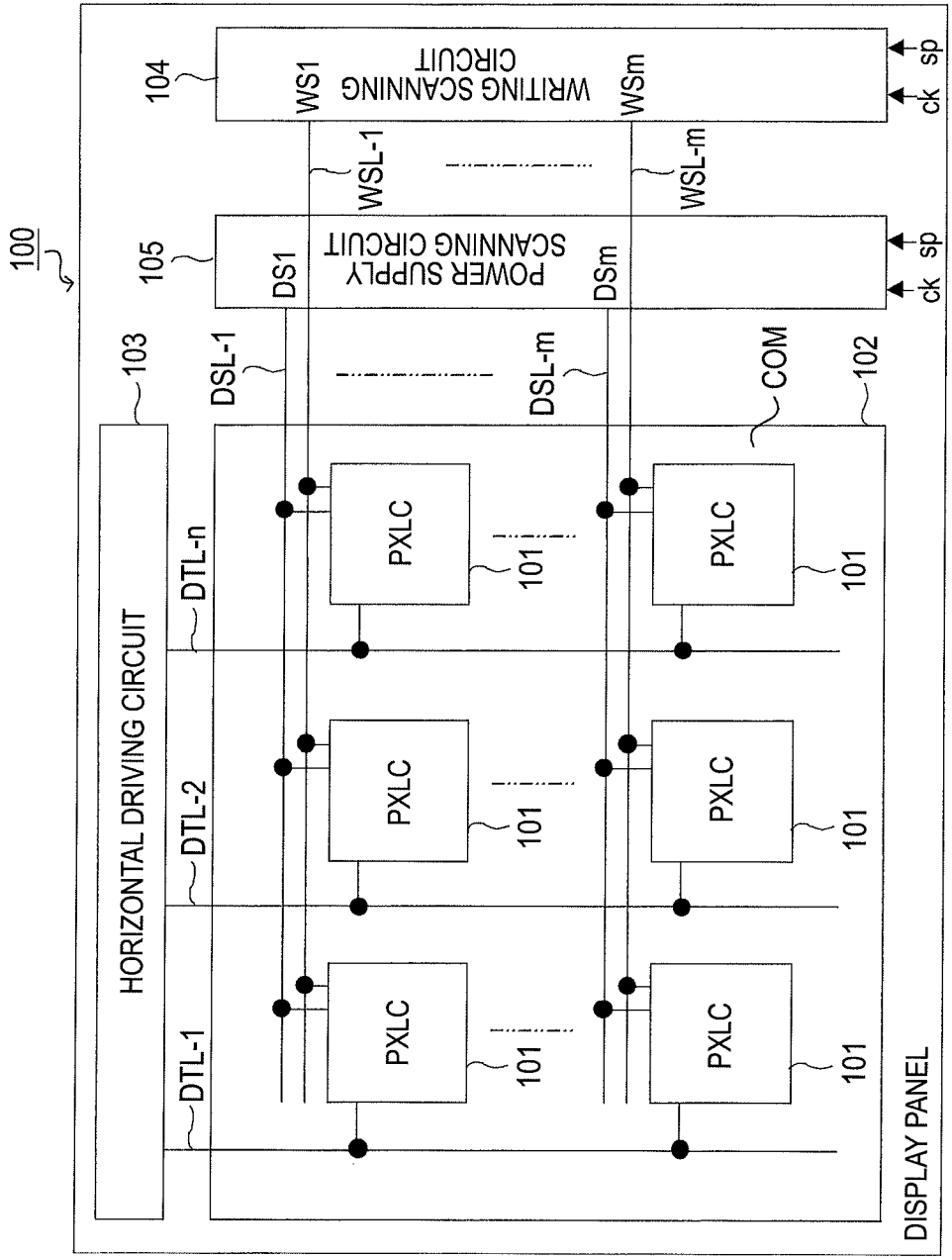
FIG. 14 is a diagram of the system configuration representing one example of this embodiment.

FIG. 14 is a diagram of the system configuration representing one example of this embodiment. As represented in FIG. 14, an organic EL display device 100 has a configuration including a pixel array unit 102 formed by two-dimensionally disposing pixels (PXLC) 101 in a matrix shape and a driving unit that is disposed on the periphery of the pixel array unit 102 and drives each pixel 101. As the driving unit that drives the pixels 101, for example, a horizontal driving circuit 103, a writing scanning circuit 104, and a power supply scanning circuit 105 are disposed.

In the pixel array unit 102, in the pixel array of m rows and n columns, scanning lines WSL-1 to WSL-m and power supply lines DSL-1 to DSL-m are wired for each pixel row, and signal lines DTL-1 to DTL-n are wired for each pixel column. The configuration of these components is the same as that represented in FIG. 1.

Pixel Structure (First Example)

Figure 15:
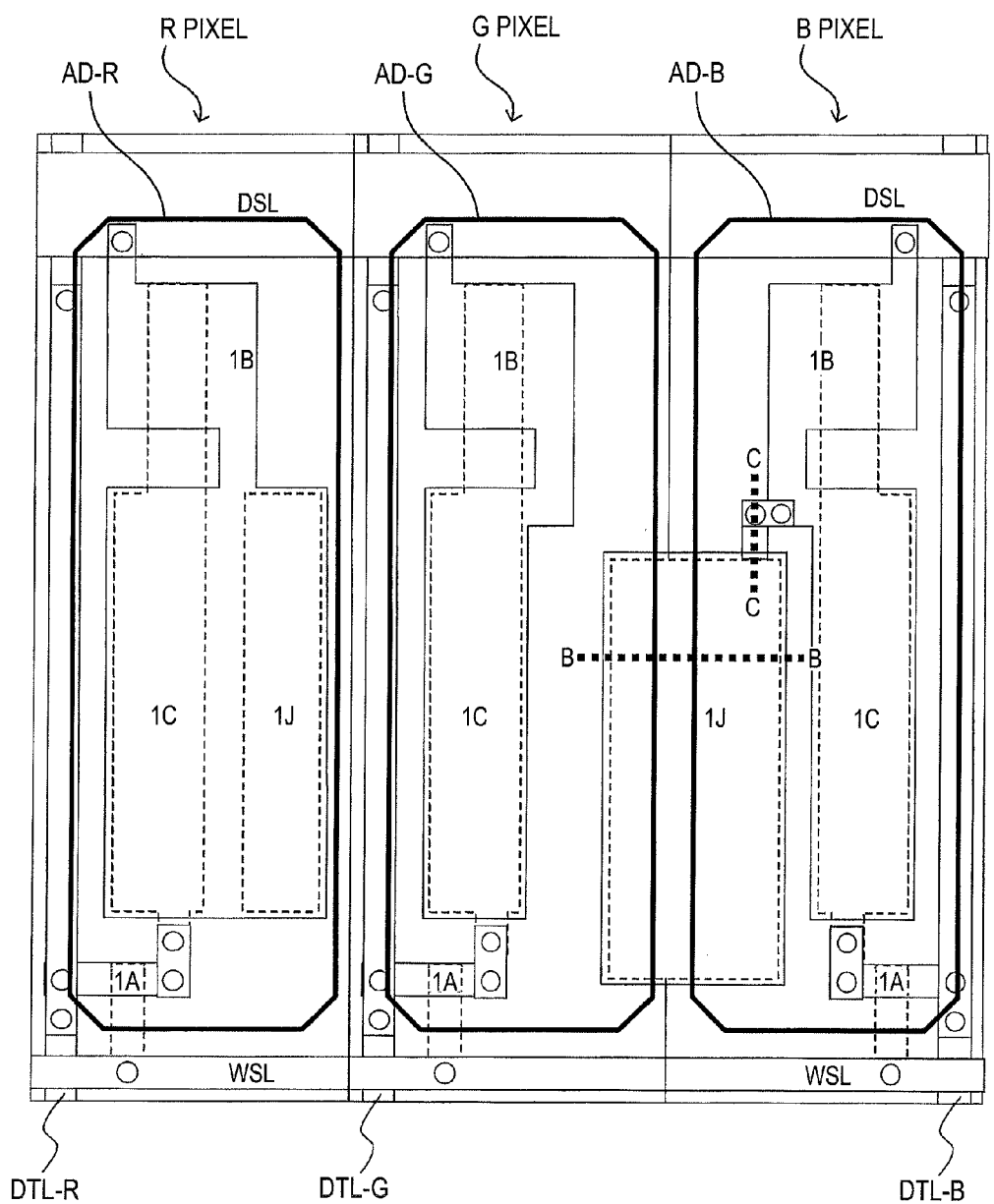
FIG. 15 is a schematic plan view illustrating an example (first example) of a pixel structure according to this embodiment.

FIG. 15 is a schematic plan view illustrating an example (first example) of a pixel structure according to this embodiment. FIG. 15 represents the disposition configuration of an R (red) pixel, a G (green) pixel, and a B (blue) pixel. Each pixel is configured between the power supply line DSL and the scanning line WSL that extend in the horizontal direction (horizontal direction in the figure), and areas of the RGB pixels are partitioned by signal lines DTL that extend in the vertical direction (the vertical direction in the figure).

Within the area of each pixel, a writing transistor 1A, a driving transistor 1B, and a holding capacitor 1C are disposed. In addition, an auxiliary capacitor 1J that is used for adjusting a writing gain or a mobility correcting time is also disposed.

In the example represented in FIG. 15, a case is shown where the pattern density of the G (green) pixel is lower than that of the R (red) pixel, and the pattern density of the B (blue) pixel is higher than that of the R (red) pixel.

In this layout, the B (blue) pixel having a high pixel density is disposed so as to be reversed in the horizontal direction with respect to the layout of the R (red) pixel and the G (green) pixel in the figure. Accordingly, in an area between the B (blue) pixel and the G (green) pixel, a signal line ETL-B is not disposed, and the auxiliary capacitor 1J of the B (blue) pixel is set in from the above-described area to the area of the G (green) pixel. In addition, the anode electrode AD is denoted by a thick solid line in the figure and is formed so as to cover each pixel.

Here, the patterns of the writing transistors 1A or the driving transistors 1B of the RGB pixels are asymmetric to one another. However, the anode electrodes AD are formed to be symmetric for allowing the aperture ratio of the organic EL element 1D to be uniform. Accordingly, below the anode electrode AD-G of the G (green) pixel, a part of the auxiliary capacitor 1J of the B (blue) pixel is disposed.

In this embodiment, an upper electrode, which is disposed on the organic EL element side, of electrodes of one pair configuring the auxiliary capacitor 1J of the B (blue) pixel is wired so as to be conductive with the cathode electrode of the organic EL element. Accordingly, of the electrodes of the auxiliary capacitor 1J of the B (blue) pixel, the upper electrode has an electric potential of the cathode electric potential, and the lower electrode has an electric potential of the anode electric potential. In other words, the upper electrode having the electric potential of the cathode electric potential is disposed between the anode electric potential of the G (green) pixel and the anode (lower electrode) of the auxiliary capacitor 1J of the B (blue) pixel. Accordingly, due to a shield effect, formation of parasitic capacitance between the anode electrode of the G (green) pixel and the anode (lower electrode) of the auxiliary capacitor 1J of the B (blue) pixel is prevented.

Figure 16:
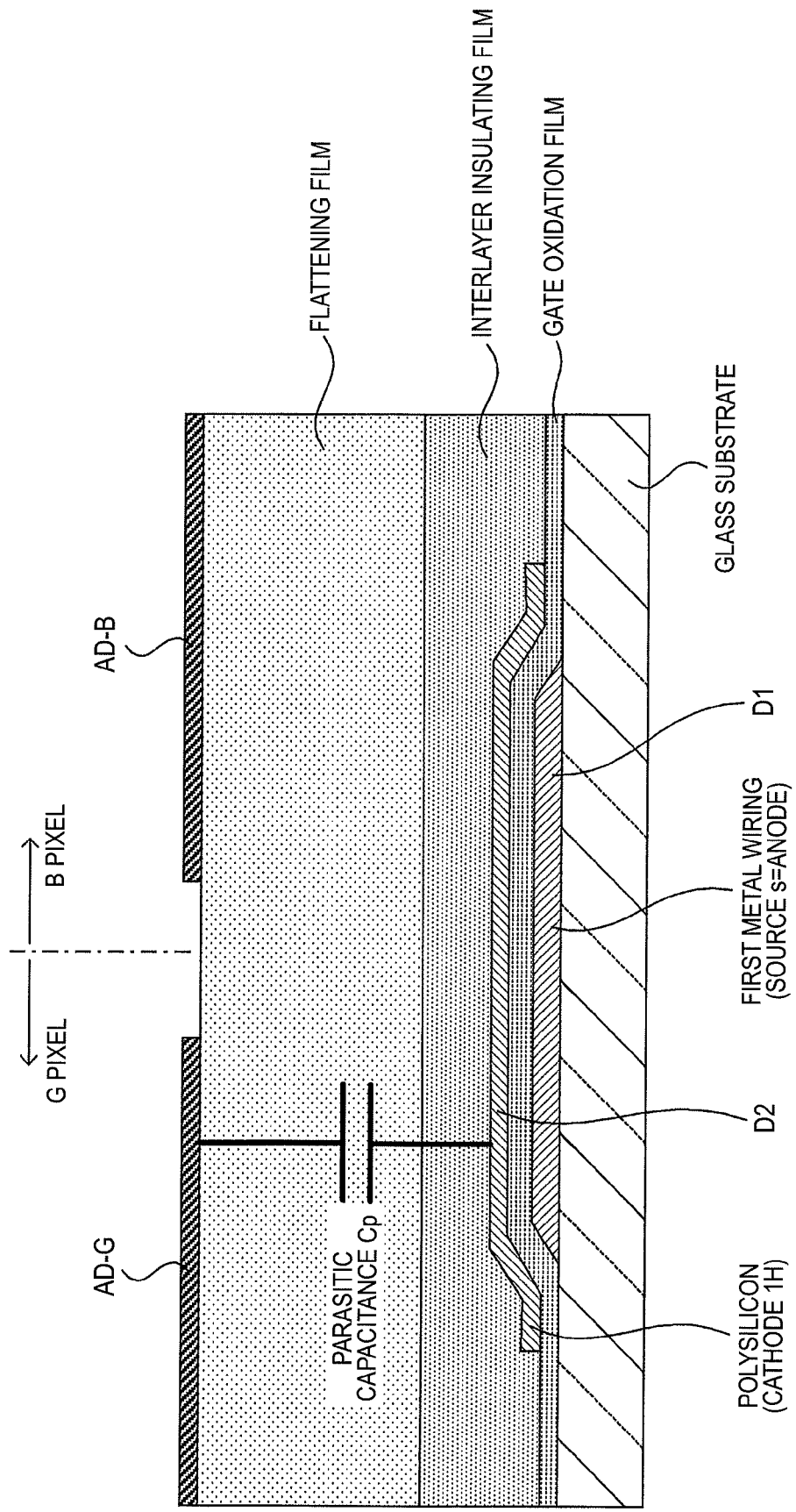
FIG. 16 is a cross-sectional view taken along line B-B shown in FIG. 15.

FIG. 16 is a schematic cross-sectional view taken along line B-B shown in FIG. 15. In the pixel structure, an anode-side electrode (the lower electrode D1) of the auxiliary capacitor 1J that is conductive with the source electrode (source s) of the driving transistor 1B that becomes a first metal wiring is disposed on a glass substrate.

In addition, a cathode-side electrode (the upper electrode D2) of the auxiliary capacitor 1J is disposed on the lower electrode D1 through a gate oxidation film. The upper electrode D1 is formed by polysilicon that forms a middle layer between the first metal wiring and the second metal wiring (not shown).

On the upper electrode D1, an anode electrode AD-G of the G (Green) pixel and an anode electrode AD-B of the B (blue) pixel are disposed through an interlayer insulating film and a flattening film. On the anode electrodes AD-G and AD-B, a multi-layered film of the organic EL element, not shown in the figure, is formed.

As described above, in this embodiment, the source s of the driving transistor 1B, that is, the anode is set in the first metal wiring that becomes the lower electrode D1 of the auxiliary capacitor 1J of the B (blue) pixel, and a cathode 1H is set in the polysilicon that becomes the upper electrode D2. Accordingly, parasitic capacitance is not configured between the anode electrode AD-G of the G (green) pixel and the anode (the lower electrode D1) of the B (blue) pixel.

In addition, the anode of the G (green) pixel and the upper electrode D2 (cathode 1H) of the B (blue) pixel configure a parallel plate, whereby parasitic capacitance CP is formed. However, the upper electrode D2 has a fixed electric potential as the cathode 1H. Thus, even when anode electric potentials of the pixels change, there may be no influence thereof on the adjacent pixels. In other words, in each pixel, the emission luminance corresponding to the video signal electric potential of the pixel can be acquired with being rarely influenced by changes in the video signal electric potentials of adjacent pixels.

Figure 17:
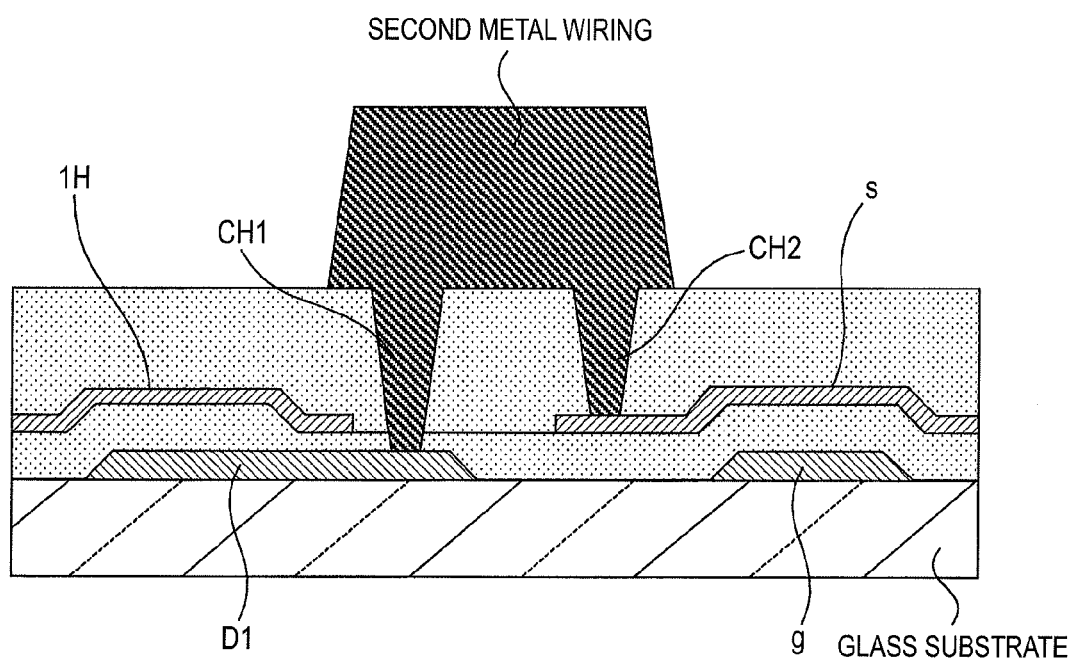
FIG. 17 is a cross-sectional view taken along line C-C shown in FIG. 15.

FIG. 17 is a schematic cross-sectional view taken along line C-C shown in FIG. 15. In this embodiment, the upper electrode D2 of the auxiliary capacitor 1J is set as the cathode 1H, and the lower electrode D1 is connected to the source s of the driving transistor 1B. Here, the lower electrode D1 is configured by a first metal wiring, and the source s of the driving transistor 1B is configured by polysilicon as a middle layer. Accordingly, in order to allow these components to be conductive with each other, contact holes are formed. In other words, a contact hole CH1 is formed in the lower electrode D2 of the auxiliary capacitor 1J, and a contact hole CH2 is formed in the polysilicon as the source s of the driving transistor 1B, and these are made to be conductive to each other by a second metal wiring.

Under the wiring structure described above, even when a configuration in which the auxiliary capacitor 1J of the B (blue) pixel is set in the area of the G (green) pixel, formation of parasitic capacitance between the anode electrode of the G (green) pixel and the electrode (lower electrode D1) of the anode electric potential of the auxiliary capacitor 1J of the B (blue) pixel is suppressed.

Pixel Structure (Second Example)

Figure 18:
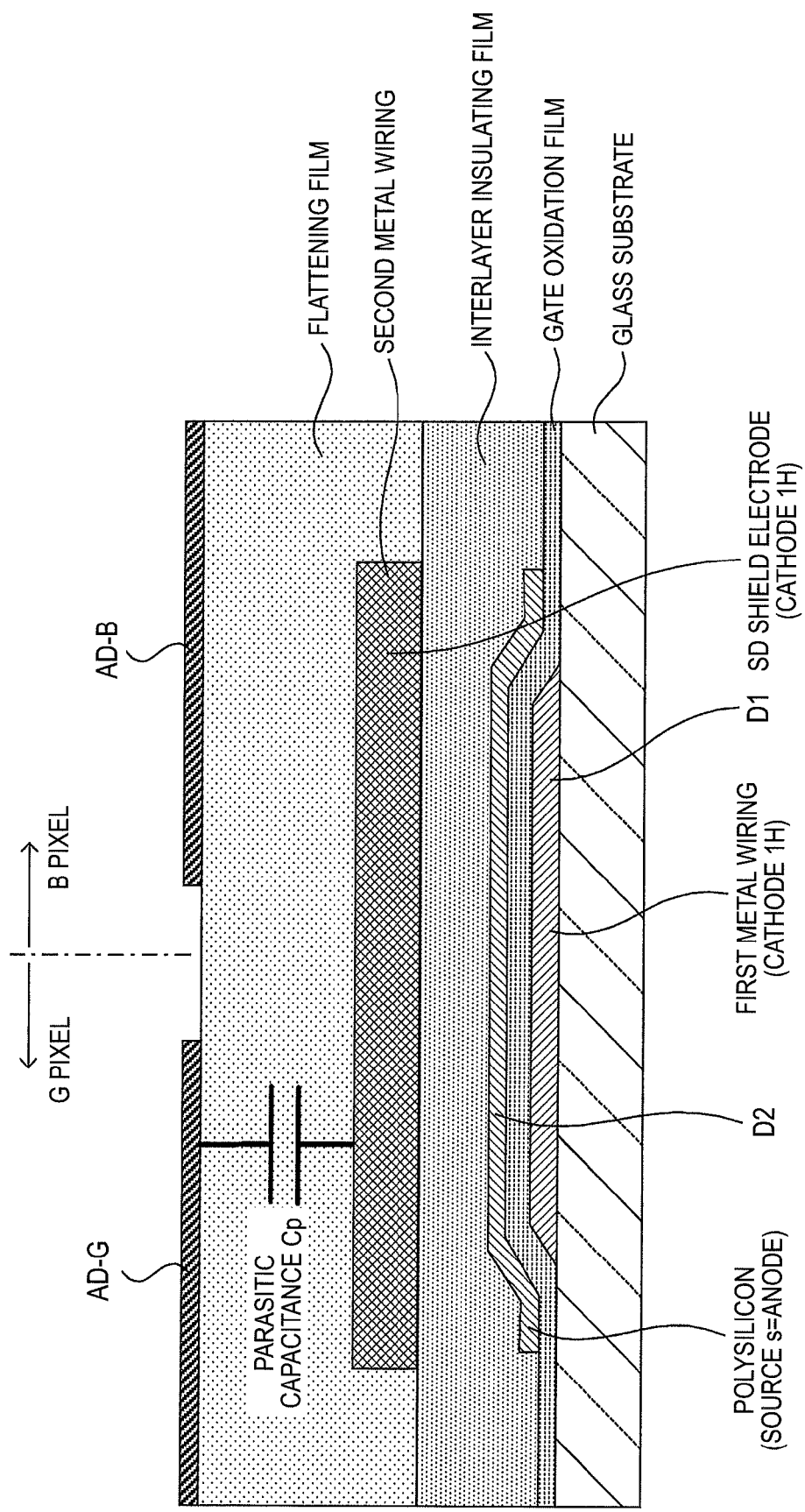
FIG. 18 is a schematic cross-sectional view illustrating an example (second example) of a pixel structure according to this embodiment.

FIG. 18 is a schematic cross-sectional view illustrating an example (second example) of a pixel structure according to this embodiment. This schematic cross-sectional view is a cross-sectional view taken along line A-A shown in FIG. 15. In this pixel structure, the auxiliary capacitor 1J of the B (blue) pixel is set in the area of the B (blue) pixel to the G (green) pixel. In addition, a shield electrode SD is disposed between the auxiliary capacitor 1J and the anode electrode AD-G of the G (green) pixel.

The lower electrode D1 of the auxiliary capacitor 1J of the B (blue) pixel is configured by the first metal wiring and is set as the cathode 1H of the organic EL element. On the other hand, the upper electrode D2 of the auxiliary capacitor 1J of the B (blue) pixel is configured by polysilicon as a middle layer and is set as the source s of the driving transistor, that is, the anode of the organic EL element.

Under such a configuration, according to this embodiment, the shield electrode SD is disposed between the upper side of the upper electrode D2 and the anode electrode AD-G of the G (green) pixel. More specifically, an interlayer insulating film is disposed on the upper electrode D2 of the auxiliary capacitor 1J of the B (blue) pixel, and the shield electrode SD is disposed on the interlayer insulating film. The shield electrode SD is configured as the second metal wiring and is conductive with the cathode 1H of the organic EL element.

On the shield electrode SD, the anode electrode AD-G of the G (green) pixel and the anode electrode AD-B of the B (blue) pixel are disposed through the flattening film. On the anode electrodes AD-G and AD-B, a multi-layered film of the organic EL element, not shown in the figure, is formed.

According to this embodiment formed by the above-described configuration, the shield electrode SD, which is the same node as the cathode 1H, is interposed between the anode electrode AD-G of the G (green) pixel and the upper electrode D2 of the auxiliary capacitor 1J of the B (blue) pixel. Accordingly, parasitic capacitance is not formed between the anode electrode AD-G of the G (green) pixel and the upper electrode D2 of the auxiliary capacitor 1J of the B (blue) pixel. In addition, even in a case where parasitic capacitance Cp is formed between the anode electrode AD-G and the shield electrode SD, the cathode 1H has a fixed electric potential. Thus, even when the anode electric potentials of the pixels change, influence thereof on the adjacent pixels is rare. As a result, in each pixel, the emission luminance corresponding to the video signal electric potential of the pixel can be acquired with being rarely influenced by changes in the video signal electric potentials of adjacent pixels.

In the above-described embodiment, a case where the present invention is applied to an organic EL display device using an organic EL element as the electro-optical element of the pixel 101 has been described as an example. However, the present invention is not limited to such an application and may be applied to all the display devices that use an electro-optical element (light emitting element) of the current-driven type in which the emission luminance changes in accordance with the value of a current flowing through the device.

4. Applications

The above-described display device according to this embodiment can be applied to various electronic apparatuses by being disposed in a main body casing thereof. As examples, the above-described display device can be applied to various electronic apparatuses shown in FIGS. 19 to 23. For example, the above-described display device can be used as a display device of electronic apparatuses in all the fields, in which a video signal input to the electronic apparatus or a video signal generated in the electronic apparatus is displayed as an image or a video, such as a digital camera, a notebook personal computer, a mobile terminal device including a cellular phone and the like, and a video camera.

As described above, by using the display device according to this embodiment as a display device of the electronic apparatuses in all the fields, the image quality of a display image can be improved. Accordingly, there is an advantage that a high-quality image display can be performed in various electronic apparatuses.

In addition, the display device according to this embodiment includes a display device having a sealed configuration in a module shape. For example, a display module that is formed by being attached to an opposing portion of a pixel array unit 102 such as transparent glass corresponds to such a display device. In the transparent opposing portion, a color filter, a protection film, or the like may be disposed, and the above-described light shield film may be additionally disposed. In addition, in the display module, a circuit unit used for input or output of a signal or the like to the pixel array unit from the outside, an FPC (flexible print circuit), or the like may be disposed.

Hereinafter, concrete examples of the electronic apparatus to which the display device according to this embodiment applies will be described.

Figure 19:
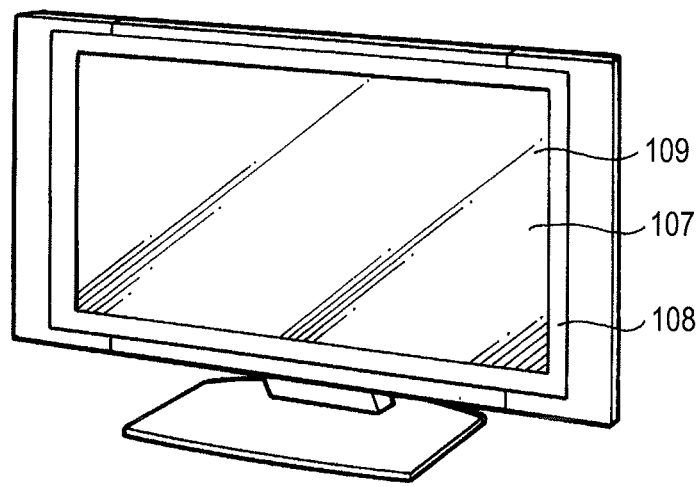
FIG. 19 is a perspective view showing the outer appearance of a television set to which this embodiment is applied.

FIG. 19 is a perspective view showing the outer appearance of a television set to which this embodiment is applied. The television set according to this application includes a video display screen unit 107 that is configured by a front panel 108, and a filter glass 109, and the like. By using the display device according to this embodiment as the video display screen unit 107, the television set is configured.

Figure 20A:
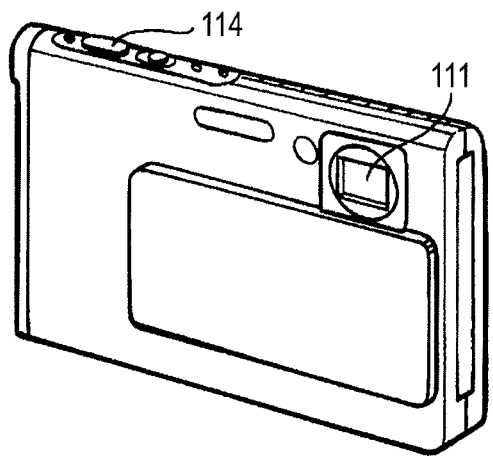
FIGS. 20A and 20B are perspective views showing the outer appearance of a digital camera to which this embodiment is applied.
Figure 20B:
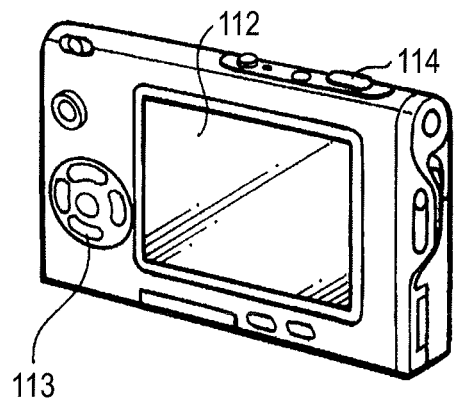

FIGS. 20A and 20B are perspective views showing the outer appearance of a digital camera to which this embodiment is applied. FIG. 20A is a perspective view viewed from the front side, and FIG. 20B is a perspective view viewed from the rear side. The digital camera according to this application includes a light emitting unit 111 for flash, a display unit 112, a menu switch 113, a shutter button 114, and the like. The digital camera is manufactured by using the display device according to this embodiment as the display unit 112.

Figure 21:
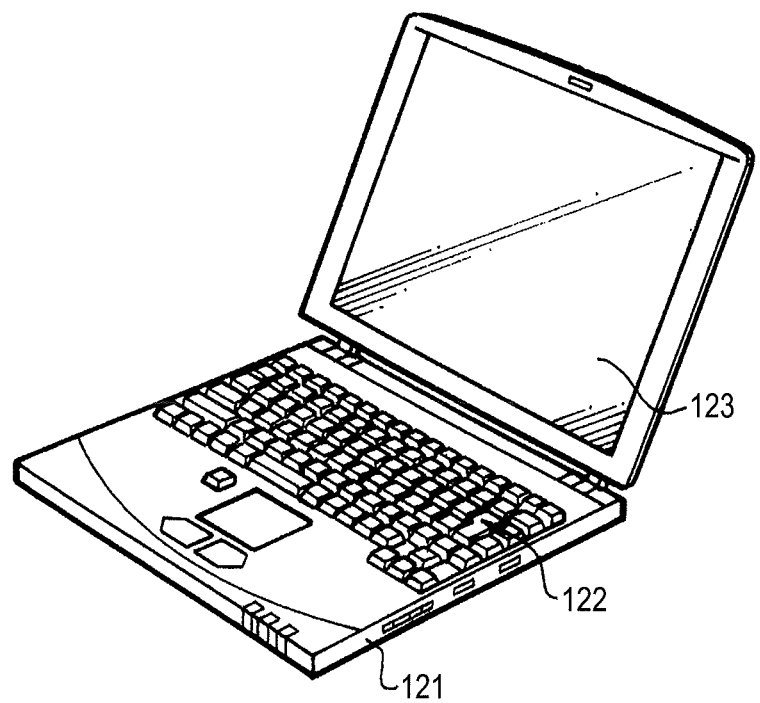
FIG. 21 is a perspective view showing the outer appearance of a notebook personal computer to which this embodiment is applied.

FIG. 21 is a perspective view showing the outer appearance of a notebook personal computer to which this embodiment is applied. The notebook personal computer according to this application includes a keyboard 122 that is operated when a text or the like is input to a main body 121, a display unit 123 that displays an image, and the like. The notebook personal computer is manufactured by using the display device according to this embodiment as the display unit 123.

Figure 22:
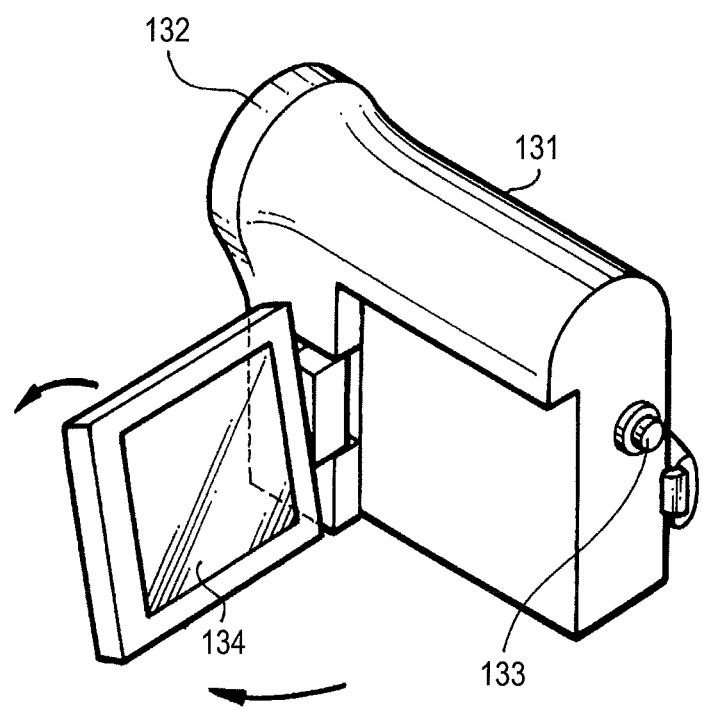
FIG. 22 is a perspective view showing the outer appearance of a video camera to which this embodiment is applied.

FIG. 22 is a perspective view showing the outer appearance of a video camera to which this embodiment is applied. The video camera according to this application includes a main body unit 131, a lens 132 disposed on a side facing the front side for photographing a subject, a start/stop switch 133 that is used for photographing, a display unit 134, and the like. By using the display device according to this embodiment as the display unit 134, the video camera is manufactured.

FIGS. 23A to 23G are diagrams showing the outer appearances of a mobile terminal device, to which this embodiment is applied, such as a cellular phone. FIG. 23A is a front view in an open state, FIG. 23B is a side view thereof, FIG. 23C is a front view in a closed state, FIG. 23D is a left side view, FIG. 23E is a right side view, FIG. 23F is a top view, and FIG. 23G is a bottom view. The cellular phone according to this application includes an upper casing 141, a lower casing 142, a connection portion (here, a hinge portion) 143, a display 144, a sub display 145, a picture light 146, a camera 147, and the like. By using the display device according to this embodiment as the display 144 or the sub display 145, the cellular phone is manufactured.

The present application contains subject matter related to that disclosed in Japanese Priority Patent Application JP 2009-003201 filed in the Japan Patent Office on Jan. 9, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a first pixel circuit;
   a second pixel circuit adjacent to the first pixel circuit along a first direction;
   a first electro-optical element connected to the first pixel circuit; and
   a second electro-optical element connected to the second pixel circuit,
   wherein the second pixel circuit includes:
      a first capacitor connected to an anode electrode of the second electro-optical element;
      a second capacitor connected to the anode electrode of the second electro-optical element;
      a writing transistor configured to sample a video signal from a signal line to the first capacitor; and
      a driving transistor configured to supply a current to the second electro-optical element according to the video signal, and
   wherein an anode electrode of the first electro-optical element overlaps with a part of the second capacitor of the second pixel circuit.

2. The display device according to claim 1, wherein the first pixel circuit includes:
   a first capacitor connected to an anode electrode of the second electro-optical element;
   a writing transistor configured to sample a video signal from a signal line to the first capacitor; and
   a driving transistor configured to supply a current to the first electro-optical element according to the video signal, and
   wherein the anode electrode of the first electro-optical element overlaps with the first capacitor of the first pixel circuit.

3. The display device according to claim 1, wherein an anode electrode of the second electro-optical element overlaps with another part of the second capacitor of the second pixel circuit.

4. The display device according to claim 1, wherein a metal wiring is disposed between the anode electrode of the first electro-optical element and the part of the second capacitor of the second pixel circuit in a cross section.

5. The display device according to claim 4, wherein the metal wiring is configured to reduce a capacitance between the anode electrode of the first electro-optical element and the part of the second capacitor of the second pixel circuit.

6. The display device according to claim 1, wherein the first capacitor is connected between a gate of the driving transistor and a source of the driving transistor.

7. The display device according to claim 1, wherein the second capacitor is connected between a voltage line and a source of the driving transistor.

8. The display device according to claim 1, wherein the second capacitor of the second pixel circuit is arranged between the first capacitor of the second pixel circuit and the first capacitor of the first pixel along the first direction.

9. A display device comprising:
   a plurality of pixel circuits formed on a substrate, and including a first pixel circuit and a second pixel circuit adjacent to the first pixel circuit,
   wherein the first pixel circuit is configured to drive a first electro-optical element,
   wherein the second pixel circuit is configured to drive a second electro-optical element, wherein the first pixel circuit includes:
  a capacitor formed by an area where a lower wiring and an upper wiring face each other;
  a transistor including a poly-silicon film and a gate electrode; and
  a metal wiring formed on an insulating film covering the capacitor and the transistor,
wherein the lower wiring is connected to the poly-silicon film of the transistor via a first contact, the metal wiring, and a second contact,
wherein the substrate is closer to the lower wiring than to the upper wiring,
wherein the upper wiring is partially overlapped by an anode electrode of the second electro-optical element, and
wherein the upper wiring is applied a fixed potential to reduce a parasitic capacitance between the anode electrode of the second electro-optical element and the lower wiring.

10. The display device according to claim 9, wherein the upper wiring is connected to the cathode electrode of the electro-optical element thereof.

11. The display device according to claim 9, wherein the first electro-optical element is configured to emit blue light.

12. The display device according to claim 11, wherein the second electro-optical element is configured to emit green light.

13. The display device according to claim 9, wherein the capacitor of the first pixel circuit is partially overlapped by the anode electrode of the second electro-optical element.

14. The display device according to claim 9, wherein the capacitor of the first pixel circuit is partially overlapped by an anode electrode of the first electro-optical element.

15. The display device according to claim 9, wherein the lower wiring of the capacitor of the first pixel circuit is connected to the anode electrode of the first light electro-optical element.

16. The display device according to claim 9, wherein the upper wiring is made of a poly-silicon.

17. The display device according to claim 9, wherein the anode electrode of the second electro-optical element is formed on a flattening film covering the metal wiring.

18. The display device according to claim 9, wherein the poly-silicon film of the transistor is formed upper than the gate electrode.

19. A display device comprising:
  a plurality of pixel circuits formed on a substrate, and including a first pixel circuit and a second pixel circuit adjacent to the first pixel circuit,
wherein the first pixel circuit is configured to drive a first electro-optical element,
wherein the second pixel circuit is configured to drive a second electro-optical element,
wherein the first pixel circuit includes:
  a capacitor formed by an area where a lower wiring and an upper wiring face each other;
  a transistor including a poly-silicon film and a gate electrode; and
  a metal wiring formed on an insulating film covering the capacitor and the transistor,
wherein the lower wiring is connected to the poly-silicon film of the transistor via a first contact, the metal wiring, and a second contact,
wherein the substrate is closer to the lower wiring than to the upper wiring,
wherein the upper wiring is partially overlapped by an anode electrode of the second electro-optical element, and
wherein the upper wiring is applied a fixed potential.

20. The display device according to claim 19, wherein the upper wiring is connected to the cathode electrode of the electro-optical element thereof.

21. The display device according to claim 19, wherein the first electro-optical element is configured to emit blue light.

22. The display device according to claim 21, wherein the second electro-optical element is configured to emit green light.

23. The display device according to claim 19, wherein the capacitor of the first pixel circuit is partially overlapped by the anode electrode of the second electro-optical element.

24. The display device according to claim 19, wherein the capacitor of the first pixel circuit is partially overlapped by an anode electrode of the first electro-optical element.

25. The display device according to claim 19, wherein the lower wiring of the capacitor of the first pixel circuit is connected to the anode electrode of the first light electro-optical element.

26. The display device according to claim 19, wherein the upper wiring is made of a poly-silicon.

27. The display device according to claim 19, wherein the anode electrode of the second electro-optical element is formed on a flattening film covering the metal wiring.

28. The display device according to claim 19, wherein the poly-silicon film of the transistor is formed upper than the gate electrode.

* * * * *